(12) United States Patent
Ooishi et al.

(10) Patent No.: US 6,597,617 B2
(45) Date of Patent: Jul. 22, 2003

(54) SEMICONDUCTOR DEVICE WITH REDUCED CURRENT CONSUMPTION IN STANDBY STATE

(75) Inventors: Tsukasa Ooishi, Hyogo (JP); Takaharu Tsuji, Hyogo (JP); Masatoshi Ishikawa, Hyogo (JP); Hideto Hidaka, Hyogo (JP); Hiroshi Kato, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/167,437

(22) Filed: Jun. 13, 2002

(65) Prior Publication Data
US 2002/0163845 A1 Nov. 7, 2002

Related U.S. Application Data

(63) Continuation of application No. 09/778,062, filed on Feb. 7, 2001, now Pat. No. 6,414,894.

(30) Foreign Application Priority Data

May 24, 2000 (JP) ........................................ 2000-152651

(51) Int. Cl.[7] ................................................ G11C 7/00
(52) U.S. Cl. .......................... 365/222; 365/228; 365/229
(58) Field of Search ................................ 365/227, 222, 365/228, 229

(56) References Cited

U.S. PATENT DOCUMENTS

| | | | | |
|---|---|---|---|---|
| 4,616,346 A | 10/1986 | Nakaizumi et al. | ......... | 365/229 |
| 4,688,196 A | 8/1987 | Inagaki et al. | ............... | 365/222 |
| 4,718,043 A | * 1/1988 | Akatsuka | ..................... | 365/227 |
| 5,075,886 A | 12/1991 | Isobe et al. | .................. | 365/194 |
| 5,113,373 A | * 5/1992 | Lee | ............................. | 365/227 |
| 5,262,998 A | * 11/1993 | Mnich | ........................ | 365/222 |
| 5,345,424 A | * 9/1994 | Landgraf | ..................... | 365/227 |
| 5,365,487 A | 11/1994 | Patel et al. | .................. | 365/226 |
| 5,465,367 A | 11/1995 | Reddy et al. | ................ | 365/222 |
| 5,696,729 A | * 12/1997 | Kitamura | ..................... | 365/227 |
| 5,740,118 A | 4/1998 | Sato et al. | .................... | 365/222 |
| 5,804,893 A | * 9/1998 | Fujioka | ......................... | 365/227 |
| 5,892,958 A | * 4/1999 | Nagashige et al. | ......... | 365/227 |
| 6,058,063 A | * 5/2000 | Jang | ............................. | 365/227 |
| 6,172,928 B1 | 1/2001 | Ooishi | ......................... | 365/222 |
| 6,240,048 B1 | * 5/2001 | Matsubara | ................... | 365/227 |

FOREIGN PATENT DOCUMENTS

| | | |
|---|---|---|
| EP | 632463 | 1/1995 |
| JP | 6-502510 | 3/1994 |
| JP | 406103758 | 4/1994 |
| JP | 406168588 | 6/1994 |
| JP | 6-282984 | 10/1994 |
| JP | 11-306752 | 11/1999 |

* cited by examiner

Primary Examiner—Tan T. Nguyen
(74) Attorney, Agent, or Firm—McDermott, Will & Emery

(57) ABSTRACT

A logic portion outputs to a DRAM portion a start address and an end address indicating a memory region where data to be stored is present prior to transition to power down mode having reduced current consumption. In the power down mode, a refresh control unit holds the start address and the end address and controls refresh to be carried out for data only in a region requiring refresh. The power supply of the logic portion is set in off state in the power down mode and accordingly a semiconductor device can consume reduced current while holding data.

3 Claims, 29 Drawing Sheets

620

SEMICONDUCTOR DEVICE WITH REDUCED CURRENT CONSUMPTION IN STANDBY STATE

This application is a Continuation of application Ser. No. 09/778,062 filed Feb. 7, 2001 now U.S. Pat. No. 6,414,894.

BACKGROUND OF THE INVENTION

1. Field of the Invention

The present invention generally relates to semiconductor devices, and particularly to reduction of current consumption in standby state of a semiconductor device having therein a dynamic semiconductor memory device requiring refresh.

2. Description of the Background Art

Recently, as personal digital assistants have widely been used, a semiconductor memory device is required to have smaller size and lower power consumption. The semiconductor memory device is often employed being integrated on one chip with a microcomputer and a large-sized logic circuit. An integrated circuit on which various circuits of such large size are mounted to implement system-on-chip is herein referred to as system LSI.

A conventional structure of a semiconductor memory device is first described before discussion on reduction in supply current consumption of the system LSI.

FIG. 35 is a schematic block diagram showing a structure of a conventional semiconductor memory device 1000.

Referring to FIG. 35, semiconductor memory device 1000 includes an external clock signal input terminal 1116 receiving externally supplied complementary clock signals ext.CLK and ext./CLK, clock input buffers 1084 and 1085 buffering the clock signals supplied to external clock signal input terminal 1116, an internal control clock signal generating circuit 1118 receiving respective outputs of clock input buffers 1084 and 1085 to generate internal clock signal int.CLK, and a mode decoder 1120 receiving an external control signal supplied to an external control signal input terminal 1110 via input buffers 1012–1020 which operate according to internal clock signal int.CLK.

External control signal input terminal 1110 receives clock enable signal CKE, chip select signal /CS, row address strobe signal /RAS, column address strobe signal /CAS and write control signal /WE.

Clock enable signal CKE is used to allow a control signal to be input to the chip. If this signal is not activated, input of the control signal is not permitted and semiconductor memory device 1000 does not accept signal input from the outside.

Chip select signal /CS is used for determining whether a command signal is input or not. When this signal is activated (at L level), a command is identified according to a combination of levels of other control signals at the rising edge of the clock signal.

Mode decoder 1120 outputs an internal control signal for controlling an operation of an internal circuit of semiconductor memory device 1000 according to these external control signals. Mode decoder 1120 outputs, as internal control signals, signal ROWA, signal COLA, signal ACT, signal PC, signal READ, signal WRITE, signal APC and signal SR.

Signal ROWA indicates that row-related access is made, signal COLA indicates that column-related access is made, and signal ACT is used to instruct that a word line is activated.

Signal PC specifies precharge operation to end a row-related circuit operation. Signal READ instructs a column-related circuit to perform reading operation, and signal WRITE instructs the column-related circuit to perform writing operation.

Signal APC specifies auto precharge operation. When the auto precharging operation is designated, precharge operation is automatically started simultaneously with the end of a burst cycle. Signal SR designates self refresh operation. When the self refresh operation starts, a self refresh timer operates. After a certain time passes, a word line is activated and the refresh operation starts.

Semiconductor memory device 1000 further includes a self refresh timer 1054 which starts its operation when self refresh mode is designated by signal SR and then designates activation of a word line, i.e., start of the refresh operation when a certain time passes, and a refresh address counter 1056 for generating a refresh address according to an instruction from self refresh timer 1054.

Semiconductor memory device 1000 further includes a reference potential input terminal 1022 receiving signal VREF which is to be used as a reference for determining whether an input signal is H or L level, a mode register 1046 holding an address signal supplied via an address signal input terminal 1112 as well as information regarding a predetermined operation mode, for example, information regarding burst length according to a combination of external control signals described above, a row address latch 1250 receiving address signals via address input buffers 1032–1038 operating according to internal clock signal int.CLK2 to hold, when a row address is input, the input row address, a column address latch 1550 receiving address signals A0–A12 to hold, when a column address is input, this column address, a multiplexer 1058 receiving respective outputs from refresh address counter 1056 and row address latch 1250 to select the output from row address latch 1250 in the normal operation and select the output from refresh address counter 1056 in self refresh operation and accordingly output the selected one, and a row predecoder 1136 receiving an output from multiplexer 1058 to predecode a row address.

Semiconductor memory device 1000 further includes a burst address counter 1060 generating an internal column address according to burst length data from mode register 1046 based on the column address held in column address latch 1550, a column predecoder 1134 receiving an output of burst address counter 1060 to predecode a corresponding column address, a bank address latch 1052 receiving bank addresses BA0–BA2 supplied to an address input terminal via input buffers 1040–1044 which operate according to internal clock signal int.CLK, and a bank decoder 1122 receiving an output of bank address latch 1052 to decode a bank address.

The address signal supplied to address signal input terminal 1112 is also used for writing data in the mode register by a combination of any bits when operation mode information is written into the mode register. For example, burst length BL, value of CAS latency CL and the like are designated by a combination of a predetermined number of bits of an address signal.

Bank address signals BA0–BA2 designate an access bank in each of the row-related access and the column-related access. Specifically, in the row-related access and the column-related access each, bank address signals BA0–BA2 supplied to address signal input buffers 1040–1044 are taken by bank address latch 1052 and then decoded by bank decoder 1122 to be transmitted to each memory array block (bank).

In addition, semiconductor memory device 1000 includes memory array blocks 100a–100g respectively serving as banks 0–7 each for independent reading/writing operation, a row decoder 1244 for selecting a row (word line) in a corresponding bank according to respective outputs from bank decoder 1122 and row predecoder 1136, a column decoder 1242 for selecting a column (bit line pair) in a corresponding bank according to an output from column predecoder 1134, an I/O port 1266 supplying data read from a selected memory cell in a selected bank to a global I/O bus G-I/O in reading operation and supplying write data transmitted by bus G-I/O to a corresponding bank in writing operation, a data input/output circuit 1086 holding externally supplied write data and supplying it to bus G-I/O in writing operation and holding read data transmitted by bus G-I/O in reading operation, and bidirectional input/output buffers 1072–1082 for transmitting input/output data DQ0–DQ31 between data input/output circuit 1086 and data input/output terminal 1070.

Bidirectional input/output buffers 1072–1082 operate in synchronization with the internal clock signal according to operation mode data held in mode register 1046.

FIG. 36 illustrates power supply potential applied from the outside to a conventional system LSI.

Referring to FIG. 36, the system LSI includes a chip CH on which a logic portion LG and a DRAM portion MEM are mounted. The DRAM portion includes a power supply generating circuit VGEN1 generating boosted potential VPP and a power supply generating circuit VGEN2 generating substrate potential VBB.

The logic portion LG receives supply potential LVDDH of 3.3V applied from the outside via a terminal T50 and potential LVDDL of 1.5V applied via a terminal T51. The DRAM portion MEM receives supply potential DVDDH of 3.3V applied from the outside via a terminal T52 and supply potential DVDDL of 1.5V applied via a terminal T53.

In such a system LSI, in order to cut supply current consumption in the standby state while data stored in a memory cell of the DRAM portion MEM is maintained, supply potentials LVDDH and LVDDL applied to the logic portion LG are set at 0V to stop power supply current from being applied. In this way, current consumption in the logic portion LG in the standby state is reduced.

Preferably personal digital assistants and the like can be operated by a battery as long as possible. In order to achieve this, power consumption of the system LSI should be reduced as much as possible.

The DRAM portion included in the system LSI requires refresh operation even in the standby state in order to preserve data stored in a memory cell. The refresh operation is carried out in every one cycle at regular intervals, or all of memory cells are successively refreshed and this successive refresh is carried out at regular intervals. In any case, during the period in which the refresh operation is performed, any circuit operation is carried out in the DRAM portion, which accompanies leakage current upon activation of a transistor. The leakage current in operation and in standby state increases as threshold voltage of an employed MOS transistor is decreased in order to accelerate the speed of operation and to lower the power supply potential. As a result, current consumption of the entire device increases.

FIG. 37 illustrates power supply potential applied to peripheral circuitry of the DRAM portion MEM shown in FIG. 36.

Referring to FIGS. 36 and 37, power supply potential DVDDL applied to the DRAM portion MEM is provided to a clock control unit 1402, a row-related command control unit 1404, a column-related command control unit 1406, a row-related address control unit 1408, a bank address control unit 1410, a column-related address control unit 1412, an input/output data-related control unit 1414 and a self refresh-related control unit 1416. Supply potential DVDDL is also applied from the outside to the peripheral circuitry except for the memory array portion shown in FIG. 36 in the conventional device. For this reason, a considerable leakage current is generated in the standby state in any circuit which is unnecessary in the refresh operation, for example, input/output data-related control unit 1414 and the like.

SUMMARY OF THE INVENTION

One object of the present invention is to provide a semiconductor device having a power down mode which enables power supply current to be consumed less while information stored in a DRAM portion is preserved in standby state.

The present invention, in brief, is a semiconductor device transmitting/receiving data in a normal mode and performing refresh of stored data with reduced current consumption in the power down mode. The semiconductor device includes a memory array, a first peripheral circuit and a second peripheral circuit.

The memory array includes a plurality of memory cells arranged in a matrix of rows and columns. The first peripheral circuit inputs/outputs data to be stored in a memory cell in the normal mode. The first peripheral circuit stops its operation for reducing current consumption in the power down mode. The second peripheral circuit controls refreshing of data held in a memory cell in the power down mode.

Accordingly, a major advantage of the present invention is that reduction of current consumption is possible by stopping the first peripheral circuit from operating in the power down mode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are hereinafter described in conjunction with the drawings.

First Embodiment

Figure 1:
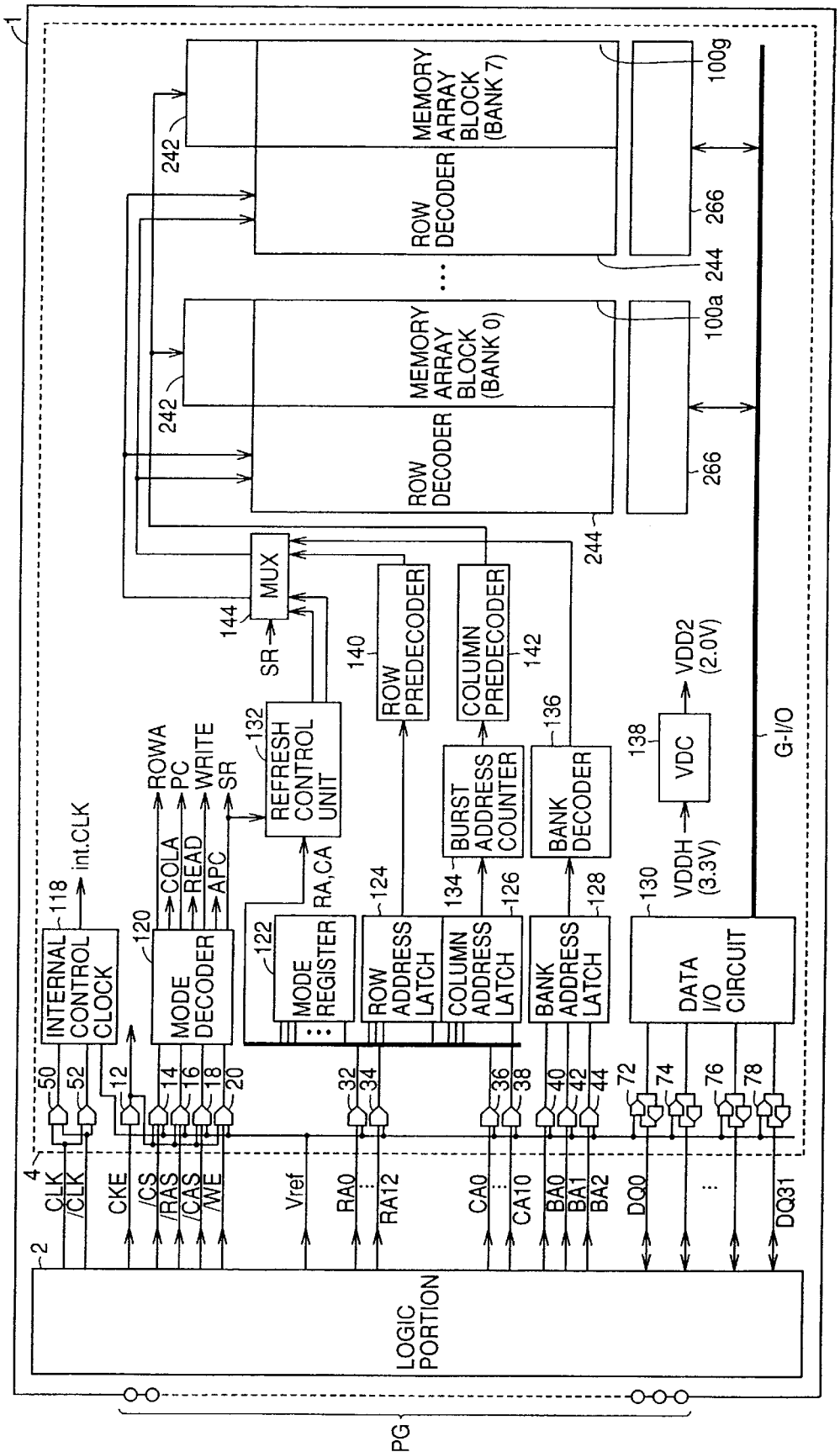
FIG. 1 is a schematic block diagram showing a structure of a semiconductor device 1 according to a first embodiment of the invention.

FIG. 1 is a schematic block diagram showing a structure of a semiconductor device 1 according to the first embodiment of the invention.

Referring to FIG. 1, semiconductor device 1 includes a large-sized logic portion 2 coupled to a group of external pin terminals PG to carry out designated processing, and a DRAM portion 4 coupled to logic portion 2 via internal interconnection to store data required by logic portion 2. Logic portion 2 outputs to DRAM portion 4, clock signals CLK and /CLK, control signals CKE, /CS, /RAS, /CAS, and /WE, reference potential Vref for taking data in, row address signals RA0–RA12, column address signals CA0–CA10, and bank address signals BA0–BA2. Logic portion 2 and DRAM portion 4 transmit and receive data signals DQ0–DQ31.

If logic portion 2 and DRAM portion 4 are integrated on one chip, it is easier to increase the number of signal lines for data transmission compared with a logic portion and a DRAM portion mounted on separate chips. Therefore, the structure in FIG. 1 does not have so-called address pin multiplexing and has separate lines for column address and row address transmitted from the logic portion to the DRAM portion.

DRAM portion 4 includes clock input buffers 50 and 52 buffering complementary clock signals CLK and /CLK supplied from logic portion 2, an internal control clock signal generating circuit 118 receiving respective outputs of clock input buffers 50 and 52 to output internal clock signal int.CLK, input buffers 12–20 receiving control signals CKE, /CS, /RAS, /CAS and /WE according to internal clock signal int.CLK, and a mode decoder 120 receiving control signals via input buffers 12–20 to output an internal control signal for controlling an operation of an internal circuit.

Clock enable signal CKE is used for permitting input of a control signal to the chip. If the clock enable signal is not activated, input of the control signal is not allowed and DRAM portion 4 does not transmit and receive data to and from the logic portion.

Chip select signal /CS is used for determining if a command signal is supplied or not. During the period in which this signal is activated (L level), a command is identified according to a combination of levels of other control signals at the rising edge of the clock signal.

Mode decoder 120 outputs as internal control signals, for example, signal ROWA, signal COLA, signal ACT, signal PC, signal READ, signal WRITE, signal APC and signal SR.

Signal ROWA indicates that row-related access is made, signal COLA indicates that column-related access is made, and signal ACT is a signal for designating activation of a word line.

Signal PC specifies precharge operation to instruct that row-related circuit operation is completed. Signal READ instructs a column-related circuit to perform reading operation, and signal WRITE instructs a column-related circuit to perform writing operation.

Signal APC designates auto precharge operation. When the auto precharge operation is designated, precharge operation is automatically started simultaneously with the end of a burst cycle. Signal SR specifies self refresh operation. For example, when a combination of control signals designating a self refresh mode is supplied from the logic portion in a standby mode, the self refresh signal SR is generated. Accordingly, the self refresh operation is started, a self refresh timer operates, and a word line is activated after a certain time passes and accordingly the refresh operation is started.

DRAM portion 4 further receives reference potential VREF used as a reference for determining whether an input signal is H level or L level.

DRAM portion 4 further includes a mode register 122 holding information regarding a predetermined operation mode according to a combination of an address signal and a control signal supplied from the logic portion, for example, information regarding burst length, a row address latch 124 receiving and holding row address signals RA0–RA12 from the logic portion, a column address latch 126 receiving and holding column address signals CA0–CA10 supplied from the logic portion, a row predecoder 140 receiving an output from row address latch 124 to predecode a row address, a burst address counter 134 generating an internal column address according to data on the burst length from mode register 122 using as a reference the column address held in column address latch 126, a column predecoder 142 receiving an output from burst address counter 134 to predecode a corresponding column address, a bank address latch 128 receiving bank addresses BA0–BA2 supplied from the logic portion via input buffers 40–44 operating according to internal clock signal int.CLK to hold a designated bank address value, and a bank decoder 136 receiving an output of bank address latch 128 to decode a bank address.

Address signals supplied from the logic portion are used for writing data into the mode register according to a combination of several bits. For example, values of burst length BL, CAS latency CL and the like are designated according to a combination of a predetermined number of bits of an address signal.

Bank address signals BA0–BA2 designate respective access banks in row-related access and column-related access. Specifically, in each of the row-related access and the column-related access, bank address signals BA0–BA2 supplied from the logic portion 2 are taken by bank address latch 128, decoded by bank decoder 136 and thereafter transmitted to each memory array block (bank).

DRAM portion 4 further includes a refresh control unit 132 receiving an address signal from the logic portion and signal SR designating the self refresh mode to control the refresh, and a multiplexer 144 for switching between a row-related control signal and a bank designation signal output from refresh control unit 132 and respective outputs of row predecoder 140 and bank decoder 136 according to signal SR.

DRAM portion 4 further includes memory array blocks 100a–100g serving as respective banks 0–7 where reading/writing operation can be performed separately, a row decoder 244 for selecting a row (word line) in a corresponding bank according to an output of multiplexer 144, a column predecoder 242 for selecting a column (bit line pair) in a corresponding bank according to an output of column predecoder 142, an I/O port 266 supplying data read from a selected memory cell in a selected bank to a global I/O bus G-I/O in reading operation and supplying write data transmitted by bus GI/O to a corresponding bank in writing operation, a data input/output circuit 130 holding write data supplied from the outside to supply it to bus G-I/O in writing operation and holding read data transmitted by bus G-I/O in reading operation, and data input/output buffers 72–78 for transmitting and receiving input/output data DQ0–DQ31 between data input/output circuit 130 and logic portion 2.

DRAM portion 4 further includes a VDC circuit 138 receiving supply potential VDDH of 3.3V from the outside to output supply potential VDD2 of 2.0V for example.

Figure 2:
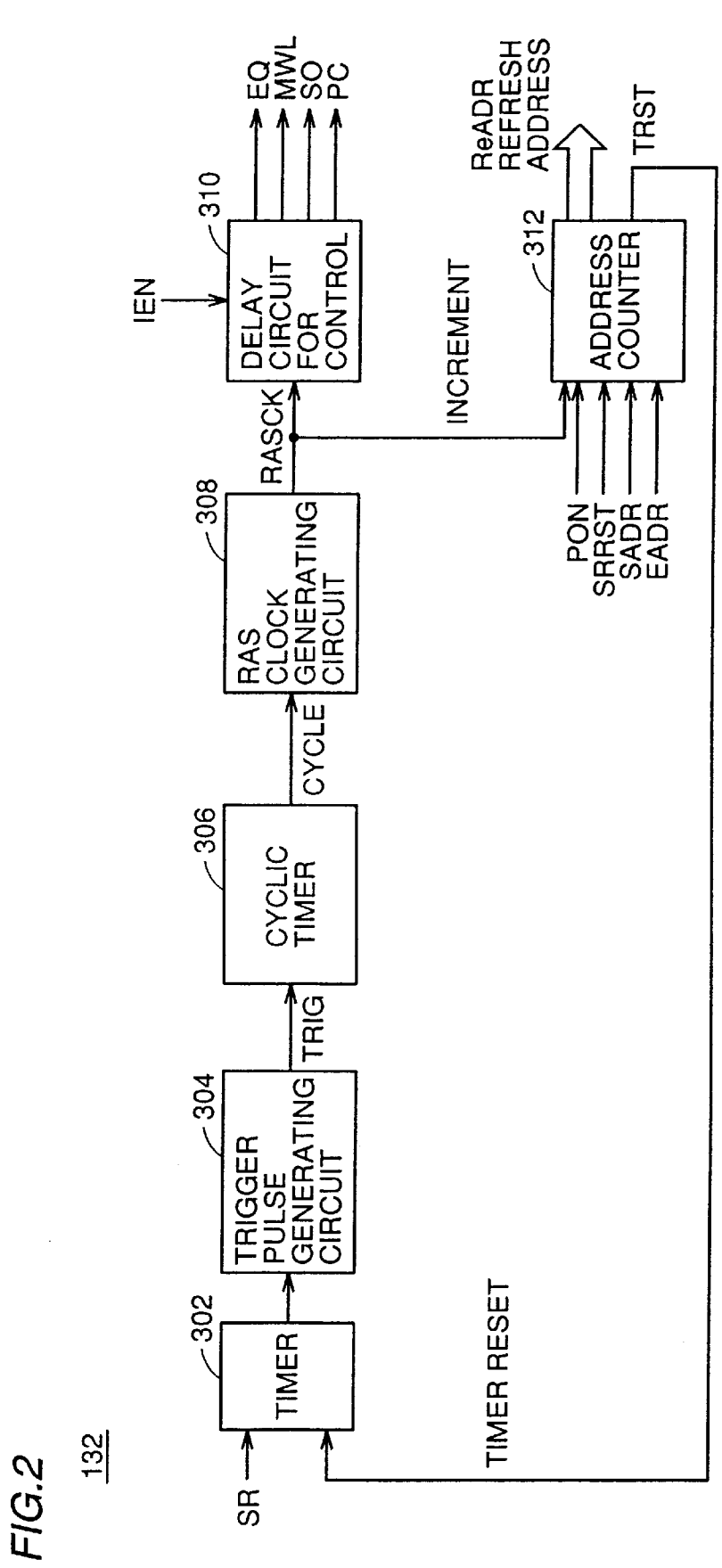
FIG. 2 is a block diagram showing a structure of a refresh control unit 132 in FIG. 1.

FIG. 2 is a block diagram showing a structure of refresh control unit 132 shown in FIG. 1.

Referring to FIG. 2, refresh control unit 132 includes a timer 302 receiving self refresh signal SR from mode decoder 120 in FIG. 1 to measure a standby period of refresh when the mode is changed to self refresh mode, a trigger pulse generating circuit 304 outputting trigger pulse TRIG according to an output of timer 302, a cyclic timer 306 outputting cycle signal CYCLE determining a cycle of word line activation in refresh according to trigger pulse TRIG, an RAS clock generating circuit 308 outputting row-related operation reference clock signal RASCK according to cycle signal CYCLE, and a delay circuit 310 for control outputting signals EQ, MWL, SO and PC at predetermined timing using clock signal RASCK as a reference. Control delay circuit 310 outputs signals EQ, MWL, SO and PC when internal enable signal IEN is activated.

Signal EQ indicates an equalize period of a bit line, signal MWL indicates an activation period of a main word line, signal SO indicates an activation period of a sense amplifier, and signal PC indicates a precharge period.

Refresh control unit 132 further includes an address counter 312 which is reset according to reset signal PON and self refresh reset signal SRRST when the power is made on, receives start address SADR and end address EADR from the logic portion, and increments an address according to clock signal RASCK. Address counter 312 outputs refresh address ReADR to the memory array and outputs timer reset signal TRST to timer 302 when one cycle of address count is completed.

Timer 302 in refresh control unit 132 is not required to operate speedily. Therefore, timer 302 is constituted of a transistor having a high threshold and has small leakage current even in operation. When the timer circuit portion detects time, trigger pulse TRIG is generated and address counter 312 starts its operation according to trigger signal TRIG. Address counter 312 is constituted of a transistor operating with a low threshold. However, in order to cut leakage current prior to detection of time by timer 302, standby state is started by a reset signal. Address counter 312 employs hierarchical power supply structure described below and can reduce the leakage current in the standby state.

Figure 3:
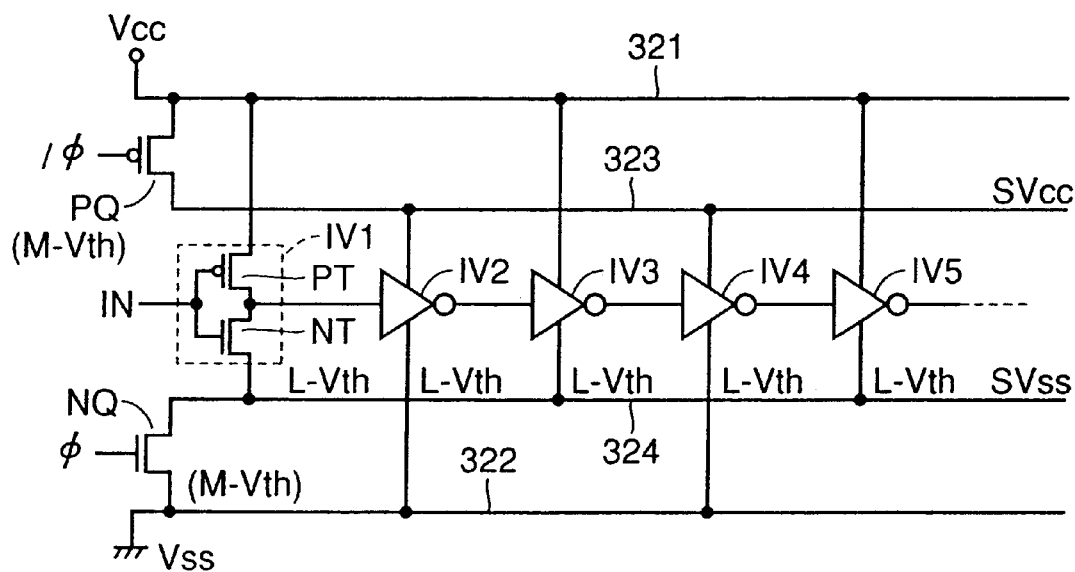
FIG. 3 is a circuit diagram illustrating a hierarchical power supply structure.

FIG. 3 is a circuit diagram illustrating the hierarchical power supply structure.

Referring to FIG. 3, five stages of inverters IV1–IV5 connected in series are shown as internal circuits. Input signal IN supplied to the first stage inverter IV1 is at L level in standby cycle. Inverters IV1–IV5 have the same structure and each include a P channel MOS transistor PT and an N channel MOS transistor NT. These MOS transistors PT and NT are low-threshold voltage (L-Vth) MOS transistors having a small absolute value of threshold voltage.

For these inverters IV1–IV5, there are provided a main supply line 321 receiving supply potential Vcc, a sub supply line 323 coupled to main supply line 321 via a P channel MOS transistor PQ for leakage cut, a main ground line 322 transmitting ground potential Vss, and a sub ground line 324 connected to main ground line 322 via an N channel MOS transistor NQ for leakage cut. Leakage cut MOS transistors PQ and NQ are constituted of respective MOS transistors each having an absolute value of the threshold voltage (M-Vth) greater than the absolute value of the threshold voltage of MOS transistors PT and NT.

MOS transistor PQ has its gate receiving control signal /φ, and MOS transistor NQ has its gate receiving control signal φ. Control signal φ is at H level in an active cycle in which an internal circuit operates. Control signal φ is at L level in a standby cycle in which the internal circuit is on standby. On the other hand, control signal φ is at L level in the active cycle and at H level in the standby cycle.

In each of inverters IV1, IV3, IV5 . . . in the stages of odd numbers in the internal circuits, the source of P channel MOS transistor PT is connected to main supply line 321 and the source of N channel MOS transistor NT is connected to sub ground line 324. In inverters IV2, IV4 . . . of the even number stages, the source of P channel MOS transistor PT is connected to sub supply line 323 and the source of N channel MOS transistor NT is connected to main ground line 322.

Figure 4:
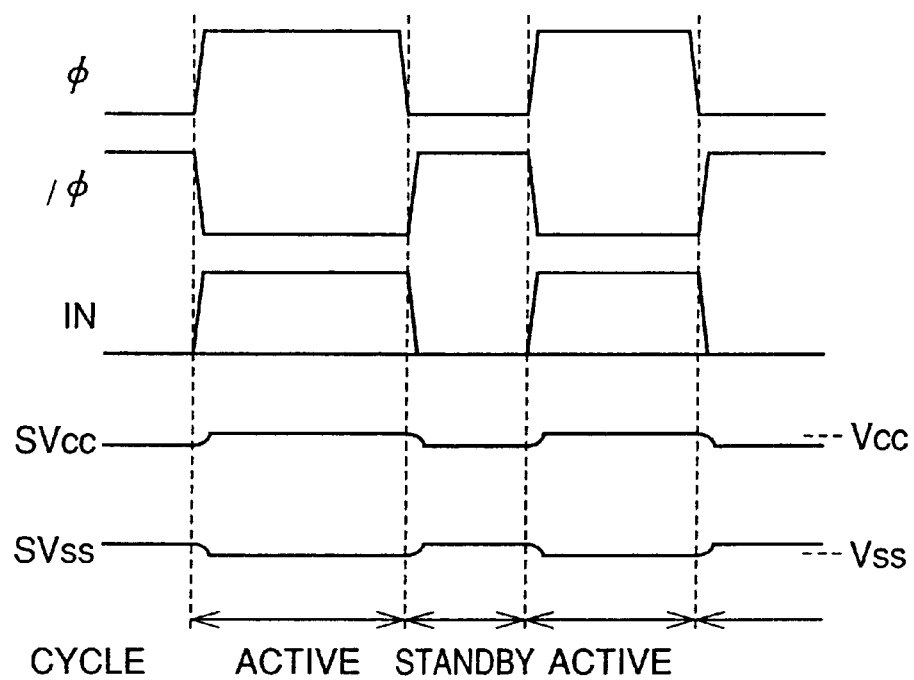
FIG. 4 is a waveform chart illustrating an operation of a circuit having the hierarchical power supply structure shown in FIG. 3.

FIG. 4 is a waveform chart illustrating an operation of a circuit having the hierarchical power supply structure shown in FIG. 3.

Referring to FIGS. 3 and 4, in the standby cycle, control signal φ is at L level and control signal /φ is at H level. Input signal IN is at L level. In this state, leakage cut MOS transistors PQ and NQ are in off state.

Inverters IV1, IV3 and IV5 of the odd number stages each have input signal IN at L level. Therefore, P channel MOS transistor PT is in on state while N channel MOS transistor NT is in off state. P channel MOS transistor PT has its source connected to main supply line 321 and N channel MOS transistor NT has its source connected to sub ground line 324.

When P channel MOS transistor PT is turned on and accordingly voltage of supply potential Vcc level on main supply line 321 is transmitted to a corresponding output node (drain), the drain potential becomes equal to the source potential and no current flows.

On the other hand, N channel MOS transistor NT receives a signal of L level at its gate and accordingly is turned off. In this state, when there is a potential difference of at least a certain value between the source coupled to the sub ground line and the drain, off-leakage current is generated. Sub ground line 324 is connected to main ground line 322 via leakage cut MOS transistor NQ having a relatively high threshold voltage M-Vth. Therefore, even if the off-leakage current flows from inverters IV1, IV3 and IV5 . . . to sub ground line 324, leakage cut MOS transistor NQ cannot discharge all of this off-leakage current. Consequently, voltage level SVss on sub ground line 324 becomes higher than ground potential Vss.

Potential SVss on sub ground line 324 is finally determined by a relation between the amount of leakage current discharged by leakage cut MOS transistor NQ and off-leakage current from inverter stage included in the internal circuit. When potential SVss on sub ground line 324 becomes higher than ground potential Vss, the portion between the gate and source of N channel MOS transistor NT in each of inverters IV1, IV3, IV5 . . . of odd number stages is set into an inverse-bias state. In this case, the off-leakage current is further reduced.

In inverters IV2, IV4 . . . of even number stages, input signal has H level. In these inverters IV2, IV4 . . . of even number stages, the source of P channel MOS transistor PT is connected to sub power supply line 323 and the source of N channel MOS transistor NT is connected to main ground line 322. In inverters IV2, IV4 . . . of even number stages, the N channel MOS transistor has the same source and drain corresponding to ground potential Vss level. In the P channel MOS transistor PT, off-leakage current is generated even in the non-conducting state.

Between main supply line 321 and sub supply line 323, leakage cut MOS transistor PQ having a relatively large absolute value (M-Vth) of threshold voltage is provided. The amount of leakage current from main supply line 321 to sub supply line 323 is determined by leakage cut MOS transistor PQ and voltage SVcc on sub supply line 323 drops lower than the level of supply potential Vcc level. The voltage level of SVcc on sub supply line 323 is finally determined by a relation between leakage current supplied from leakage cut MOS transistor PQ and the total of off-leakage current in inverters IV2, IV4 . . . of even number stages. When voltage SVcc becomes lower than supply potential Vcc, in inverters IV2, IV4 . . . of even number stages, the portion between the gate and source of P channel MOS transistor PT is set into reverse-bias state and the off-leakage current is further reduced.

In the active cycle, control signal φ has H level and control signal /φ has L level, leakage cut MOS transistors PQ and NQ are turned on, main supply line 321 is connected to sub supply line 323, and main ground line 322 is connected to sub ground line 324.

Accordingly, voltage SVcc on sub supply line 323 has supply potential Vcc and potential SVss on sub ground line 324 has ground potential Vss level. In this active cycle, input signal IN appropriately changes according to operation state. MOS transistors of inverters IV1–IV5 . . . constituting internal circuits are each a MOS transistor having low threshold voltage and operate at a high speed. Current supply capability of leakage cut MOS transistors PQ and NQ is set at a large value for ensuring the operation of this internal circuit.

The hierarchical structure described above is thus realized by providing a main supply line and a sub supply line as supply lines and a main ground line and a sub ground line as ground lines. In this way, the impedance of supply line/ground line is increased to reduce the leakage current in the standby cycle, and the impedance of the supply line/ ground line is reduced in the active cycle in order to achieve a high speed operation by MOS transistors having low threshold voltage in the internal circuits. Address counter 312 in FIG. 2 can have such a hierarchical power supply structure so as to implement a semiconductor device having reduced current consumption in the standby period in which no refresh is performed in the power down mode and operates at a high speed in the refresh.

In the standby period in which self refresh is carried out, MOS transistors PQ and NQ are turned off, substrate potential is made lower than the source potential of the transistor to further reduce the leakage current so that further reduction of the leakage current is realized. The leakage current can further be reduced by decreasing current supplied to a common source line of a sense amplifier in the memory array.

Figure 5:
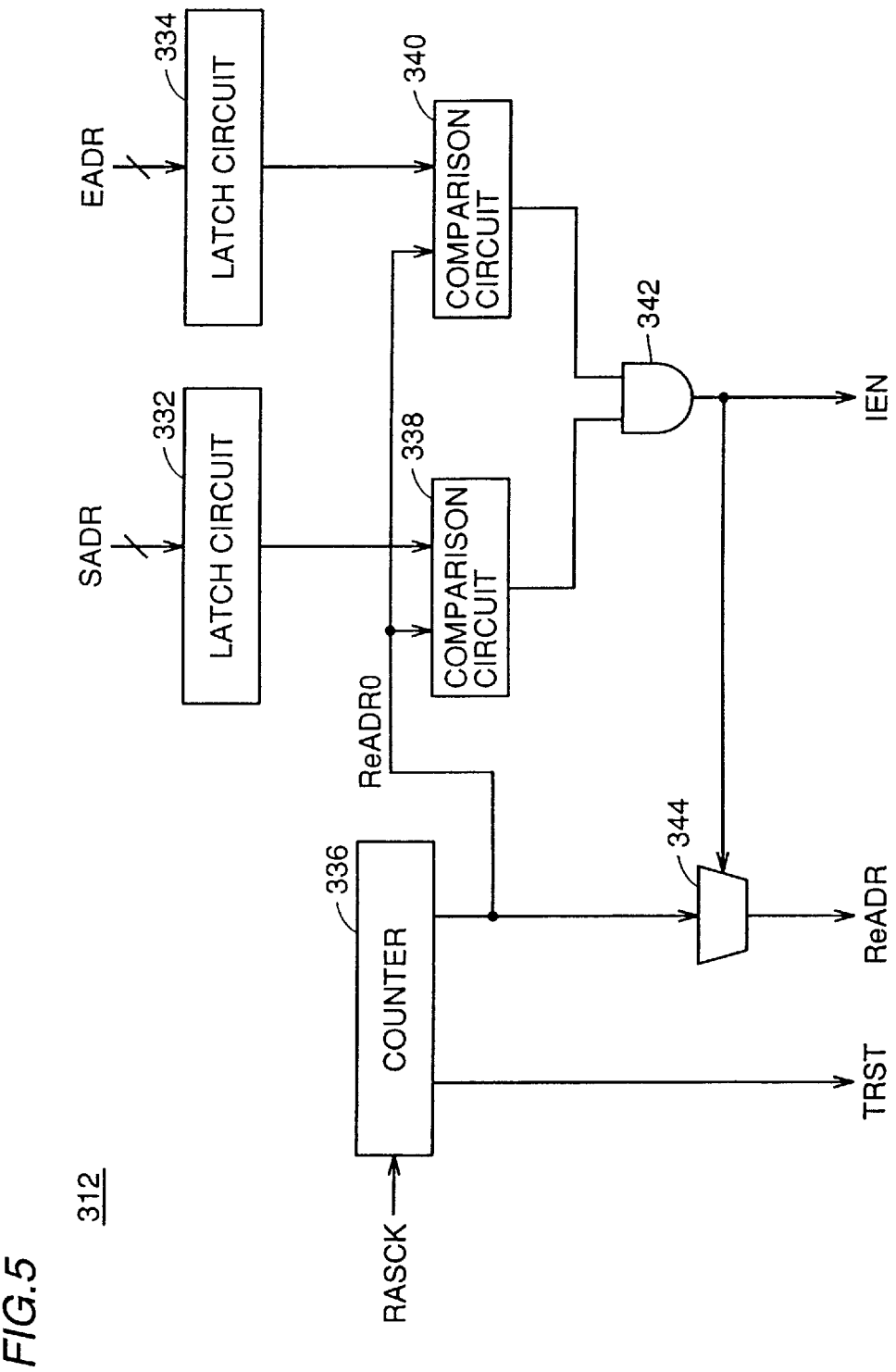
FIG. 5 is a block diagram showing a first example of an address counter 312 in FIG. 2.

FIG. 5 is a block diagram showing a first example of address counter 312 in FIG. 2.

Referring to FIG. 5, address counter 312 includes a latch circuit 332 receiving and holding start address SADR from the logic portion, a latch circuit 334 receiving and holding end address EADR supplied from the logic portion, and a counter 336 performing count-up operation according to clock signal RASCK from RAS clock generating circuit 308 in FIG. 2, outputs refresh address ReADR0, and outputs timer reset signal TRST at the end of one cycle of refresh addresses.

Address counter 312 further includes a comparison circuit 338 comparing refresh address ReADR0 output from counter 336 with start address SADR held by latch circuit 332 to activate an output when refresh address ReADR0 is equal to or greater than start address SADR, a comparison circuit 340 comparing refresh address ReADR0 with end address EADR held by latch circuit 334 to activate an output when refresh address ReADR0 is equal to or smaller than end address EADR, an AND circuit 342 receiving respective outputs of comparison circuits 338 and 340 to output internal enable signal IEN, and a buffer circuit 344 receiving refresh address ReADR0 to output refresh address ReADR to the row decoder of the memory array when enable signal IEN is activated.

Figure 6:
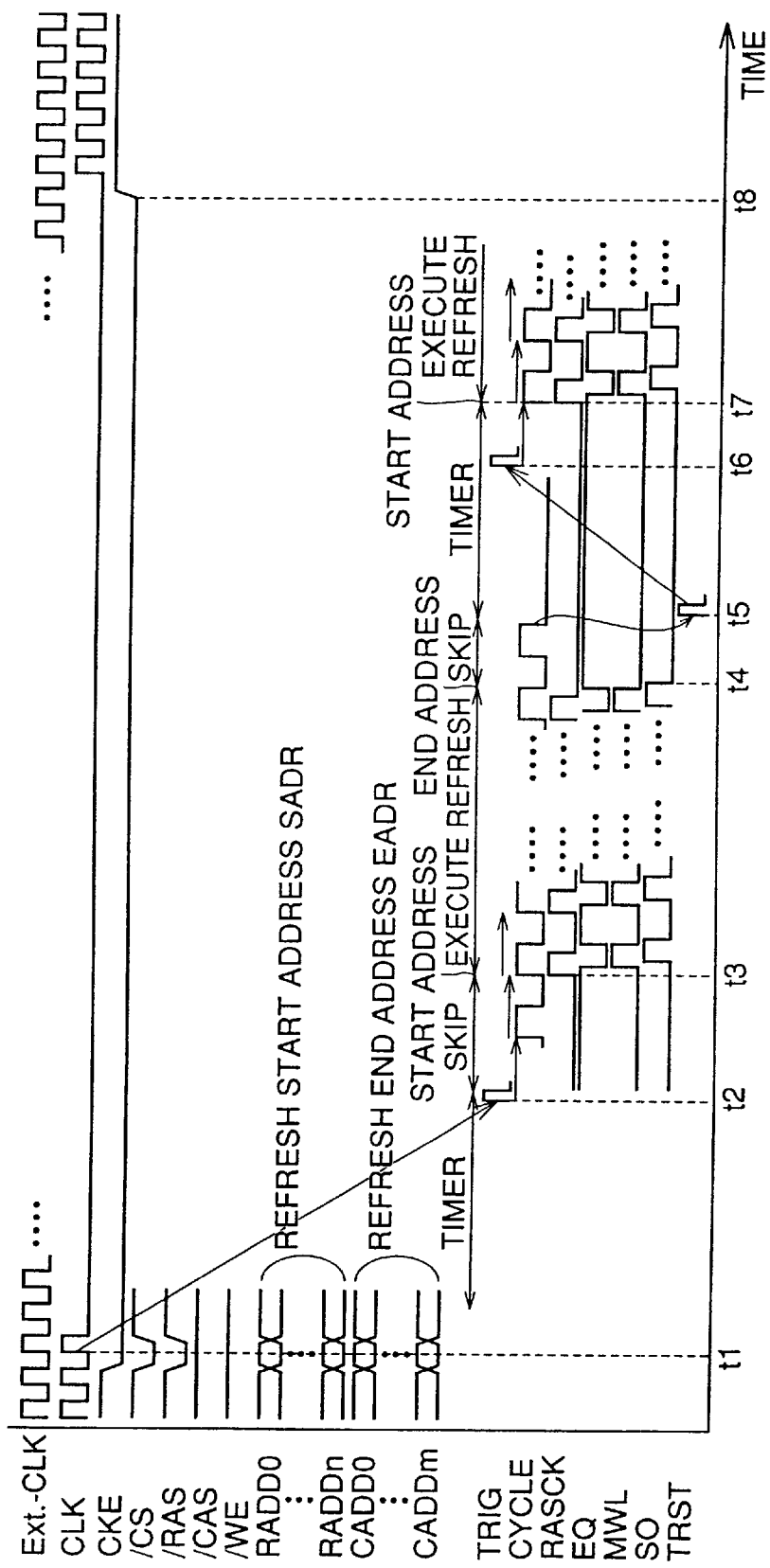
FIG. 6 is an operation waveform chart illustrating an operation of address counter 312 shown in FIG. 5.

FIG. 6 is an operation waveform chart illustrating an operation of address counter 312 shown in FIG. 5.

Referring to FIGS. 5 and 6, preceding input of a command at time t1, the DRAM portion is instructed by the logic portion to perform refresh before transition to power down mode. After time t1, internal clock signal CLK is fixed at L level according to decreasing of supply voltage of the logic portion and clock signal supplied to the DRAM portion is inactivated.

At time t1, a command determined by a combination of control signals /CS, /RAS, /CAS and /WE specifies a power down mode.

In the system LSI including therein the DRAM, input of an address from the outside is unnecessary. Therefore, even if the number of bits of an address signal supplied to the DRAM portion from the logic portion increases, the number of external terminals is not increased. Therefore, there is no need to employ so-called address pin multiplexing and a row address and a column address are transmitted by separate lines.

A start address and an end address for designating a region to be refreshed are supplied from the logic circuit. In refresh, designation of a column address is unnecessary. The logic circuit thus supplies a refresh start address as row address signals RADD0–RADDn and supplies a refresh end address as column address signals CADD0–CADDn. Refresh is performed between the start address and the end address and no refresh operation is carried out for other addresses and they are skipped. These addresses may be specified by a bank address for example.

The refresh start address SADR and refresh end address EADR are supplied from the logic portion to the DRAM portion when the logic portion uses the DRAM portion, prior to the power down mode, by recognizing a memory region where information should be held in transition to the power down mode. At time t1, when the refresh start address and the refresh end address are held in latch circuits 332 and 334 in address counter 312 of the DRAM portion, supply of the power supply voltage to the logic portion is stopped to reduce power consumption.

When self refresh signal SR is input from mode decoder 120 in FIG. 1 to refresh control unit 132, a reference clock is generated by a ring oscillator contained in timer 302 in FIG. 2, transition to power down mode occurs after refresh in the normal operation and the standby period from the transition to the following refresh operation is measured.

At time t2, timer 302 supplies a predetermined output because that it is a predetermined time and accordingly trigger pulse generating circuit 302 outputs trigger pulse TRIG. Cyclic timer 306 then outputs cycle signal CYCLE in a period corresponding to the refresh cycle and accordingly clock signal RASCK is input to address counter 312. Clock signal RASCK is input to counter 336 of address counter 312 and counter 336 successively outputs refresh address signal ReADR0. However, refresh operation is unnecessary for a memory region which holds no necessary information. For the purpose of reducing power consumption, comparison circuit 338 and comparison circuit 340 determine whether refresh address signal ReADR0 generated currently by counter 336 is present between a start address and an end address and accordingly internal enable signal IEN is output.

From time t2 to time t3, the refresh address signal is smaller than the start address. Therefore, an output of buffer circuit 344 is inactivated and internal enable signal IEN is also inactivated.

No refresh address is transmitted to the memory array and no control signal is transmitted from control delay circuit 310. These signals have their levels fixed and current consumption is accordingly reduced by the amount of current for driving a signal line by these signals.

At time t3, when refresh address ReADR0 output from counter 336 and start address held by latch circuit 332 matches, an output of comparison circuit 338 changes and internal enable signal IEN is accordingly activated so that execution of refresh is started.

At time t4, when end address EADR held by latch circuit 334 and refresh address ReADR0 counted up by counter 336 according to clock signal RASCK match, an output of comparison circuit 340 changes and accordingly internal enable signal IEN is inactivated. Then, refresh of a necessary region is completed and no refresh is carried out for subsequent addresses. At time t5, when addresses generated by counter 336 are all used, counter 336 outputs timer reset signal TRST and the standby period is measured again by timer 302. In this standby period, address counter 312 is set in a standby state in the hierarchical power supply structure described above.

At time t6, when timer 302 indicates that the standby period has passed, trigger pulse TRIG is accordingly activated, and address counter 312 changes to the active mode to start counting of a refresh address. At time t7, when the refresh address matches start address, refresh is carried out for a memory cell which stores information to be preserved.

At time t8, clock enable signal CKE is activated to H level, power is applied to the logic circuit and clock signal CLK is input to the DRAM portion. Then, all memory areas are first refreshed by inserting a dummy cycle considering the case in which refresh is completed in the way in the power down mode. After this, data is transmitted and received again between the logic circuit portion and the DRAM portion.

Figure 7:
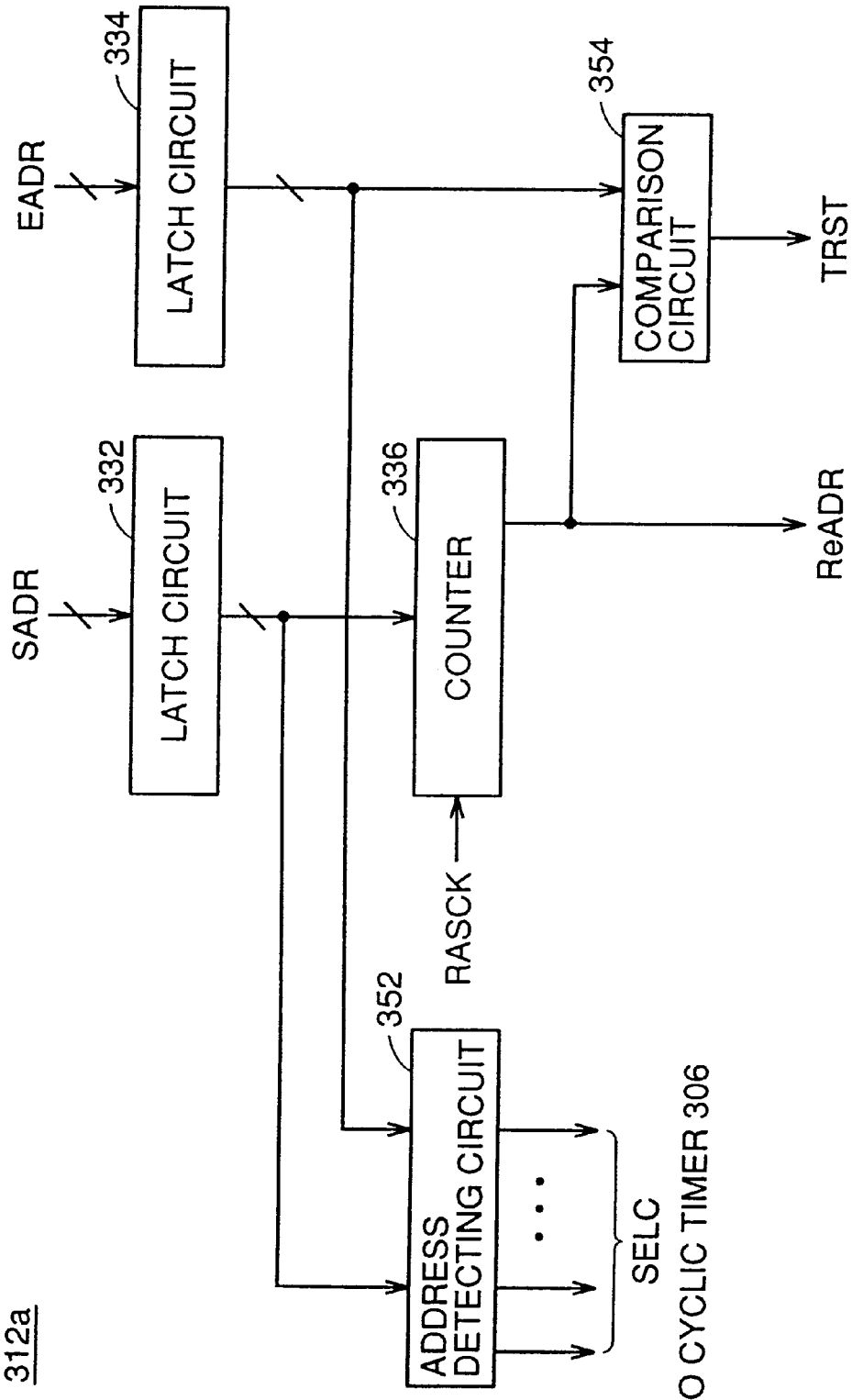
FIG. 7 is a block diagram showing a structure of an address counter 312a which is a modification of address counter 312.

FIG. 7 is a block diagram showing a structure of an address counter 312*a* as a modification of address counter 312.

Referring to FIG. 7, address counter 312*a* is different in the structure from address counter 312 in that an address detecting circuit 352 and a comparison circuit 354 are included instead of comparison circuits 338 and 340, AND circuit 342 and buffer circuit 344. Other components are similar to those of address counter 312 and description thereof is not repeated here.

When address detecting circuit 352 receives start address SADR and end address EADR from latch circuits 332 and 334, it detects the ratio of an address region to be refreshed to the entire address region and outputs to cyclic timer 306 in FIG. 2 cycle selection signal SELC for selecting a refresh cycle.

In cyclic timer 306, the number of stages of counter circuits included is changed according to cycle selection signal SELC so as to change the refresh cycle. According to this cycle, clock signal RASCK is input to counter 336 and the cycle for counting up refresh address ReADR is changed. For example, if 4012 word line addresses are self-refreshed in 32 ms, the period of clock signal RASCK can be made four times provided that the start address and end address are selected in the range of one-fourth of addresses of 4012 word lines. Refresh can be carried out at dispersed times and accordingly, the peak current can be reduced which is advantageous for reducing power consumption in the standby state.

When refresh address ReADR output from counter 336 matches end address EADR held by latch circuit 334, comparison circuit 354 outputs timer reset signal TRST to timer 302 in FIG. 3.

Figure 8:
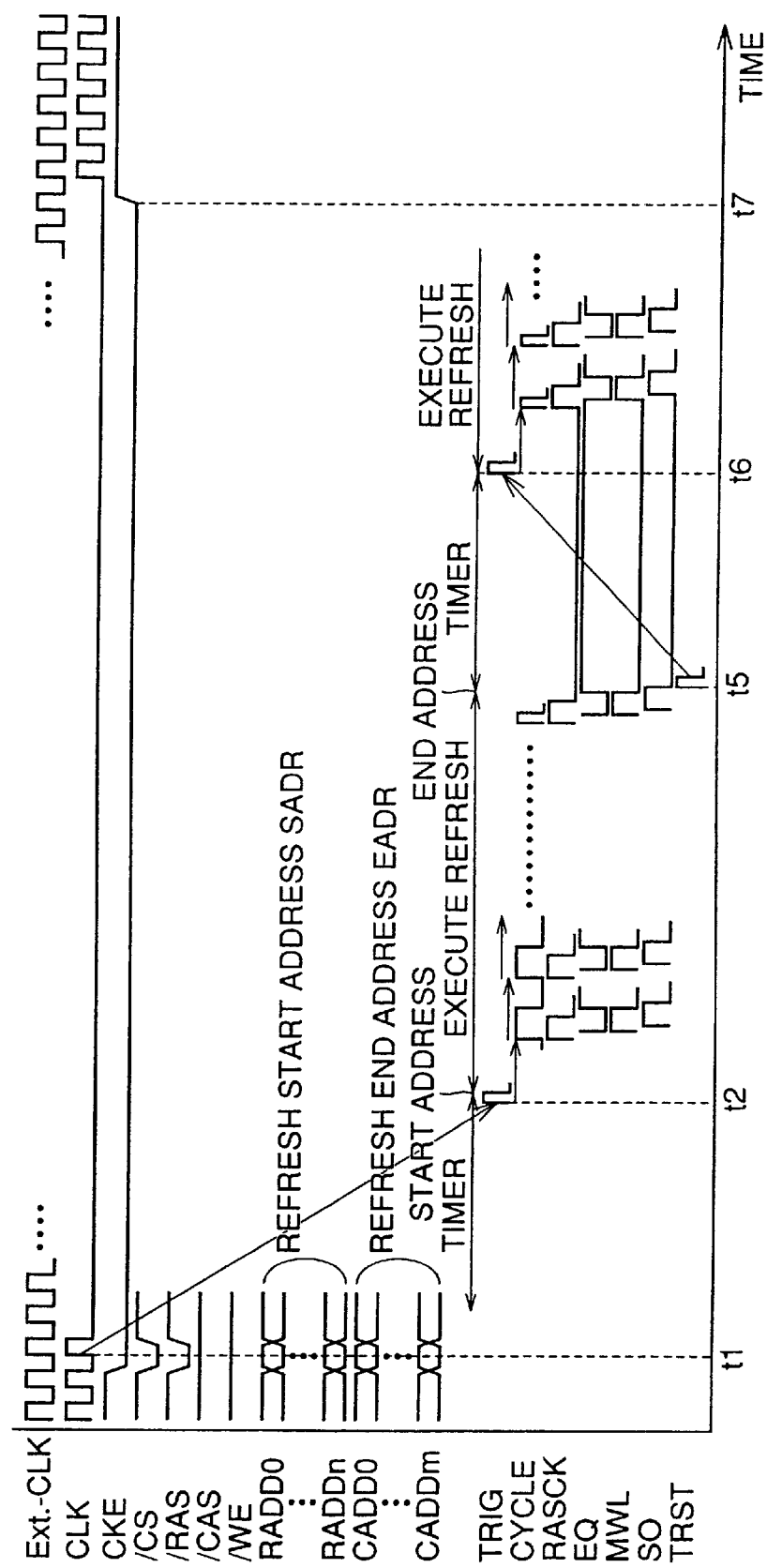
FIG. 8 is an operation waveform chart illustrating an operation of address counter 312a in FIG. 7.

FIG. 8 is an operation waveform chart illustrating an operation of address counter 312a in FIG. 7.

Referring to FIGS. 7 and 8, at time t1, a self refresh command as well as a refresh start and end addresses are input and timer 302 measures a standby period until time t2 as described in conjunction with FIG. 6.

At time t2, trigger pulse TRIG is activated according to change of an output of timer 302. Then, cyclic timer 306 generates cyclic pulse CYCLE according to refresh cycle selected by address detecting circuit 352. Counter 336 starts count up of refresh address ReADR from start address SADR received from latch circuit 332. Different from the operation shown in FIG. 6, the period is extended by the ratio of the memory region skipped in the FIG. 6 and refresh is continued to the end address.

At time t5, when the refresh address output from counter 336 matches the end address, timer reset signal TRST is output from comparison circuit 354, and timer 302 starts measuring the standby period again. In this period, the address counter is set in the standby mode.

This structure is advantageous in that refresh period is extended to reduce the peak value of current consumption as long as the refresh interval of a memory cell is allowed, and accordingly power consumption can be reduced.

Second Embodiment

The first embodiment has been described according to which power consumption is reduced by decreasing the refresh region. It is also possible to cut the power consumption by employing a structure in which power is made off for a certain portion of the internal circuit of the DRAM portion in the power down mode, for example.

Figure 9:
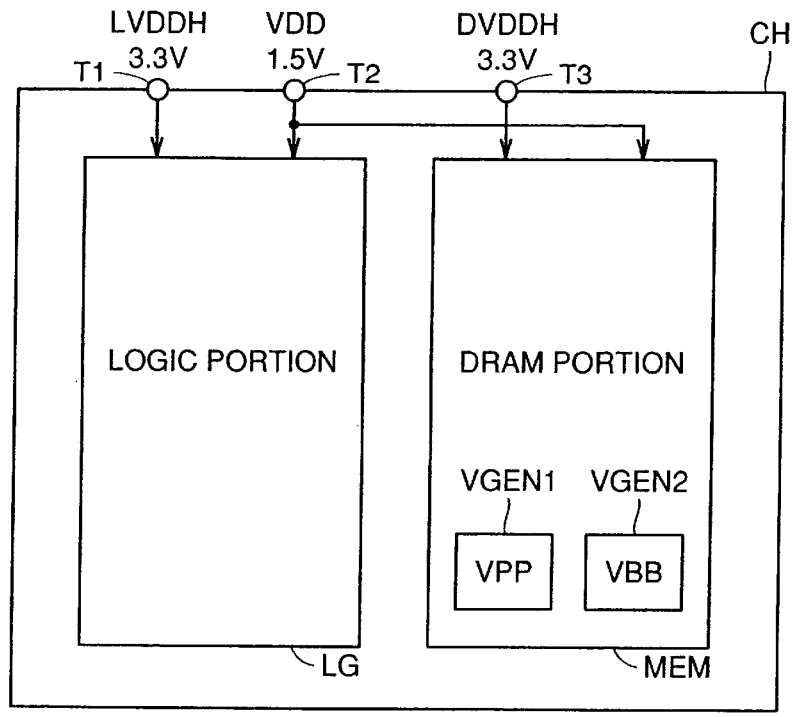
FIG. 9 illustrates that power supply is externally provided to a semiconductor device according to a second embodiment.

FIG. 9 illustrates that power is externally supplied to a semiconductor device according to the second embodiment.

Referring to FIG. 9, a semiconductor device CH has a logic portion LG and a DRAM portion MEM. In the DRAM portion, a voltage generating circuit VGEN1 for generating boosted potential VPP and a voltage generating circuit VGEN2 for generating substrate potential VBB are provided.

Logic portion LG receives supply potential LVDDH of 3.3V via a terminal T1 and receives supply potential VDD of 1.5V via a terminal T2. Supply potential VDD is also applied to DRAM portion MEM. Supply potential DVDDH of 3.3V is applied to DRAM portion MEM via a terminal T3.

In this semiconductor device, supply potentials LVDDH and VDD provided to logic portion LG are set in off state in the power down mode. DRAM portion MEM operates to refresh information held by a memory cell only by supply potential DVDDH in the power down mode.

Figure 10:
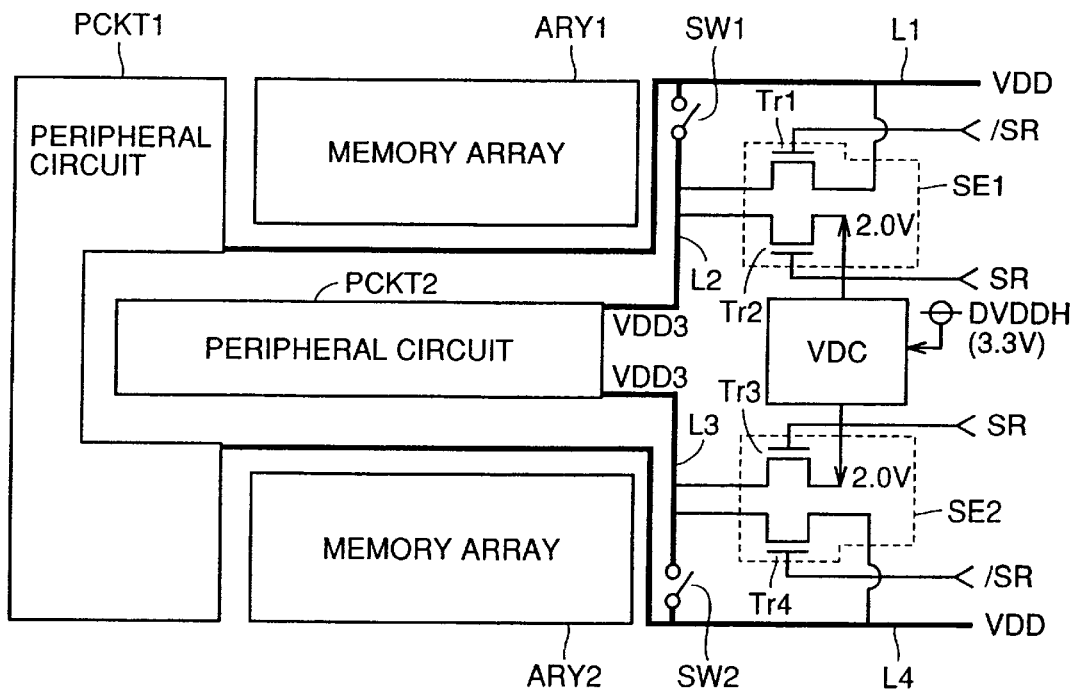
FIG. 10 shows a structure in which power supply potential is applied to an internal circuit of a DRAM portion shown in FIG. 9.

FIG. 10 shows a structure for providing supply potential to an internal circuit of the DRAM portion in FIG. 9.

Referring to FIG. 10, for memory arrays ARY1 and ARY2 including memory cells for holding data arranged in a matrix of rows and columns in the DRAM portion, peripheral circuits PCKT1 and PCKT2 are provided for controlling their operations.

The memory cell arrays operate with a high voltage and the peripheral circuit portions operate with 1.5V in the normal operation. Especially the peripheral circuit portions are often supplied with the same power source. Further, in order to operate them with a low voltage external power source, the threshold voltage or the like of a transistor constituting the peripheral circuit is reduced. In this case, a problem occurs that leakage current increases due to reduction of the threshold voltage. The leakage current also leads to power loss when power is being applied in non-operating state of the peripheral circuits.

In order to reduce the leakage current, peripheral circuit PCKT1 operates by receiving from the outside supply potential VDD of 1.5V via supply lines L1 and L4. The power supply is made off in the power down mode and accordingly the leakage current is reduced.

To the peripheral circuit PCKT2, supply potential VDD3 is continuously supplied in order to perform refresh operation or the like for memory arrays ARY1 and ARY2 even in the power down mode. Only the supply potential DVDDH of 3.3V is applied to the DRAM portion in the power down mode as shown in FIG. 9. Therefore, the DRAM portion generates supply potential VDD3 for operating peripheral circuit PCKT2 from supply potential DVDDH in the power down mode.

Specifically, there are provided a voltage down converter circuit VDC receiving supply potential DVDDH of 3.3V to decrease it to approximately 2.0V, and power supply selection circuits SE1 and SE2 selectively applying supply potential VDD and an output of voltage down converter circuit VDC to respective supply lines L1 and L4.

Power supply selection circuit SE1 includes an N channel MOS transistor Tr2 activated by self refresh signal SR to transmit an output of voltage down converter circuit VDC to supply line L2, and an N channel MOS transistor Tr1 turned on according to signal /SR which is an inverted version of the self refresh signal to supply power supply potential VDD to supply line L2 in the normal operation.

Power supply selection circuit SE2 is activated according to self refresh signal SR to reduce an output of voltage down converter circuit VDC by the threshold voltage to supply it to supply line L3, and an N channel MOS transistor Tr4 turned on according to signal /SR to supply externally provided power supply potential VDD to supply line L3 in the normal operation.

A switch SW1 for connecting supply lines L1 and L2 and a switch SW2 for connecting supply lines L3 and L4 are provided for any user requiring no power down mode. For example, switches SW1 and SW2 may be implemented by an aluminum mask option (using an optional photomask for aluminum line to change interconnections) employed in a manufacturing process of a semiconductor device.

Figure 11:
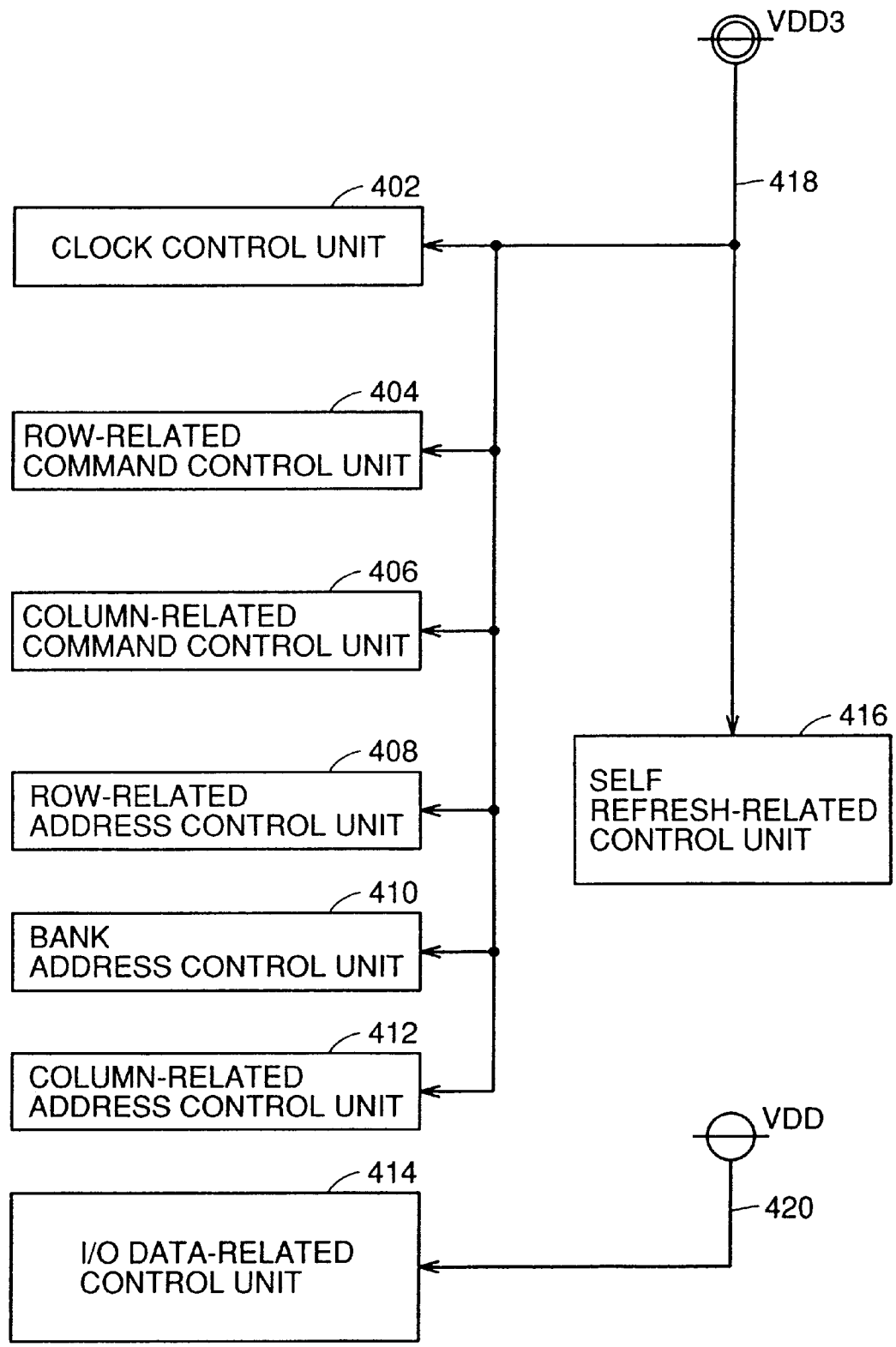
FIG. 11 illustrates a first example of grouping peripheral circuits PCKT1 and PCKT2 shown in FIG. 10.

FIG. 11 illustrates a first example of grouping in peripheral circuits PCKT1 and PCKT2 in FIG. 10.

Referring to FIG. 11, the DRAM portion generally includes as the peripheral circuit a clock control unit 402, a row-related command control unit 404, a column-related command control unit 406, a row-related address control unit 408, a bank address control unit 410, a column-related address control unit 412, an input/output data-related control unit 414 and a self refresh-related control unit 416.

Clock control unit 402 includes for example clock input buffers 50 and 52 and internal control clock signal generating circuit 118 illustrated in FIG. 1.

Row-related command control unit 404 includes for example input buffers 12–20 and a portion of mode decoder 120 that generates a row-related command. Column-related command control unit 406 includes input buffers 12–20 and a portion of mode decoder 120 that generates a column-related command.

Row-related address control unit 408 includes for example row address latch 124 and row predecoder 140. Bank address control unit 410 includes for example input buffers 40–44, bank address latch 128 and bank decoder 136. Column-related address control unit 412 includes for example column address latch 126, burst address counter 134 and column predecoder 142. Input/output data-related control unit 414 includes data input/output buffers 72–78 and data input/output circuit 130. Self refresh-related control unit 416 includes refresh control unit 132 and multiplexer 144.

According to the first grouping shown in FIG. 11, input/output data-related control unit 414 operates with supply potential VDD applied from the outside and other components operate with supply potential VDD3 generated in the power down mode based on supply potential DVDDH described above in conjunction with FIG. 10. Specifically, in FIG. 11, input/output data-related control unit 414 is included in peripheral circuit PCKT1, and peripheral circuit PCKT2 includes clock control unit 402, row-related command control unit 404, column-related command control unit 406, row-related address control unit 408, bank address control unit 410, column-related address control unit 412 and self refresh-related control unit 416.

Figure 12:
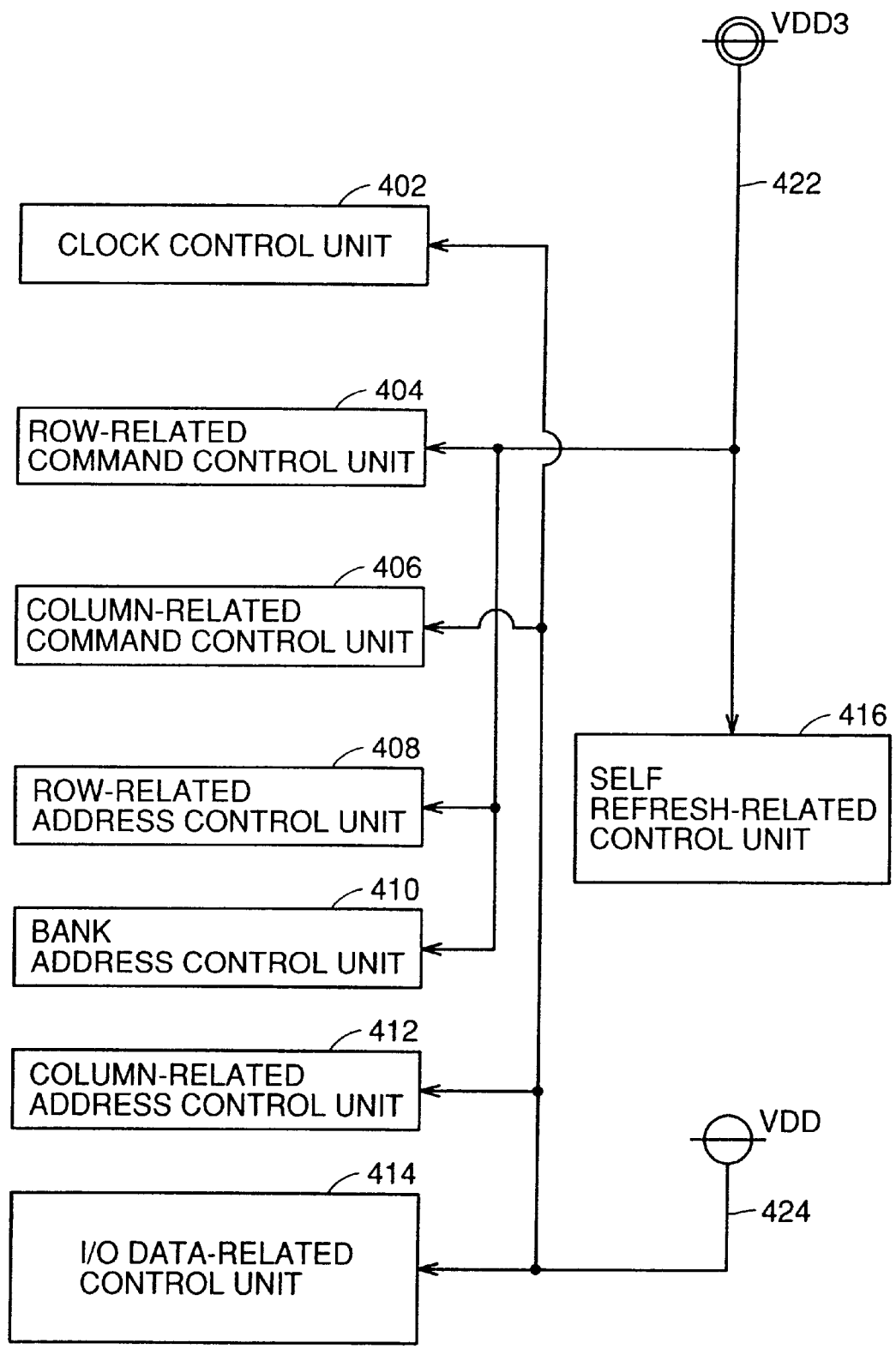
FIG. 12 illustrates a second example of grouping peripheral circuits.

FIG. 12 illustrates a second example of grouping in the peripheral circuit.

Referring to FIG. 12, external supply potential VDD is supplied to input/output data-related control unit 414, column-related address control unit 412, column-related command control unit 406 and clock control unit 402 via a supply line 424. Supply potential VDD3 is supplied to self refresh-related control unit 416, row-related command control unit 404, row-related address control unit 408, and bank address control unit 410 via a supply line 422.

In the structure shown in FIG. 12, peripheral circuit PCKT1 in FIG. 10 includes clock control unit 402, column-related command control unit 406, column-related address control unit 412 and input/output data-related control unit 414. Peripheral circuit PCKT2 includes row-related command control unit 404, row-related address control unit 408 and bank address control unit 410.

Figure 13:
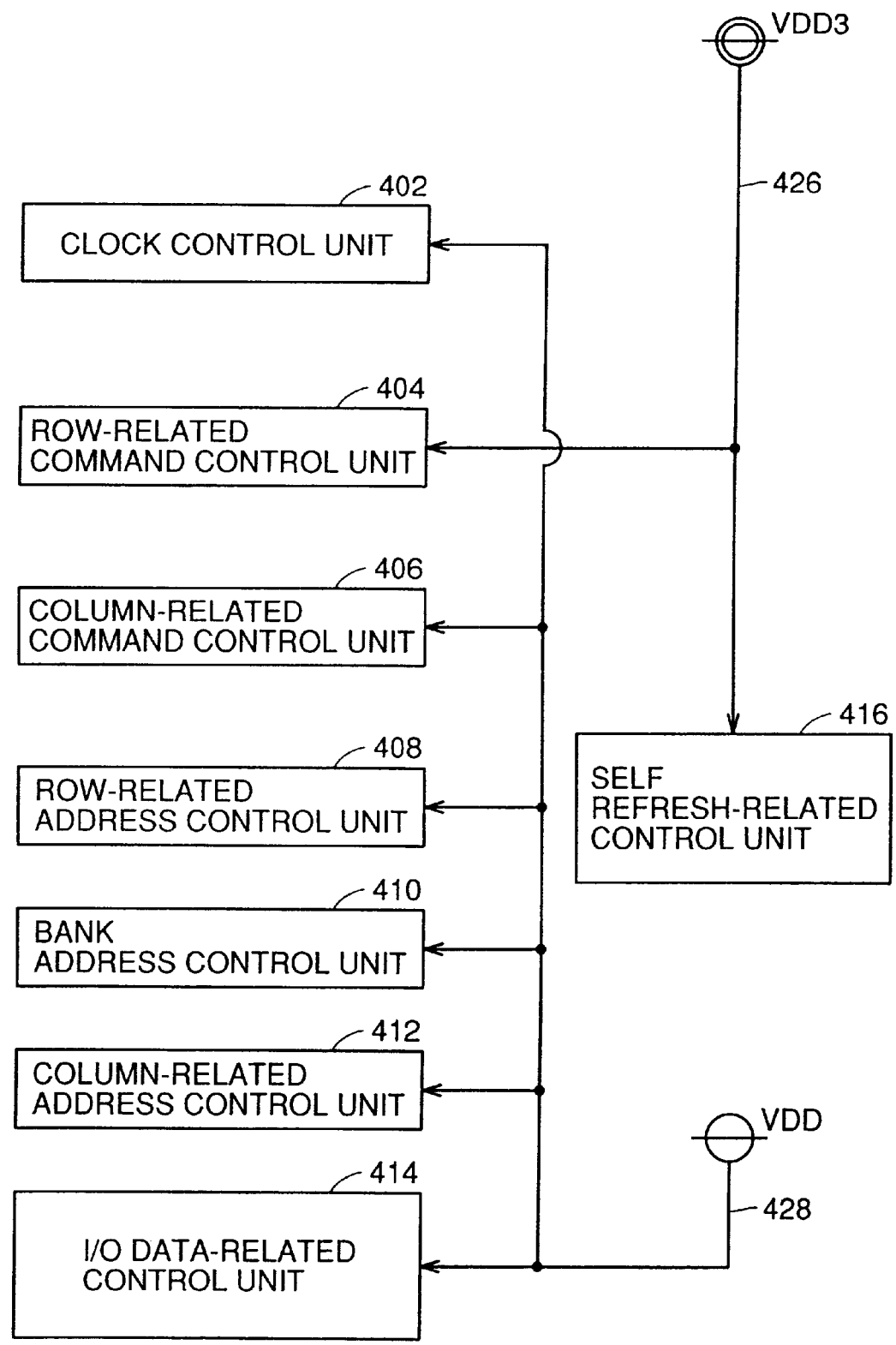
FIG. 13 illustrates a third example of grouping peripheral circuits.

FIG. 13 illustrates a third example of grouping in the peripheral circuit.

Referring to FIG. 13, external supply potential VDD is supplied via a supply line 428 to clock control unit 402, column-related command control unit 406, row-related address control unit 408, bank address control unit 410, column-related address control unit 412 and input/output data-related control unit 414. Supply potential VDD3 is applied to self refresh-related control unit 416 and row-related control unit 404 via a supply line 426.

In the grouping illustrated in FIG. 13, peripheral circuit PCKT1 in FIG. 10 includes clock control unit 402, column-related command control unit 406, row-related address control unit 408, bank address control unit 410, column-related address control unit 412 and input/output data-related control unit 414. Peripheral circuit PCKT2 includes row-related command control unit 404 and self refresh-related control unit 416.

The portion described below is a main concern when the power supply of any block is partially made off.

Figure 14:
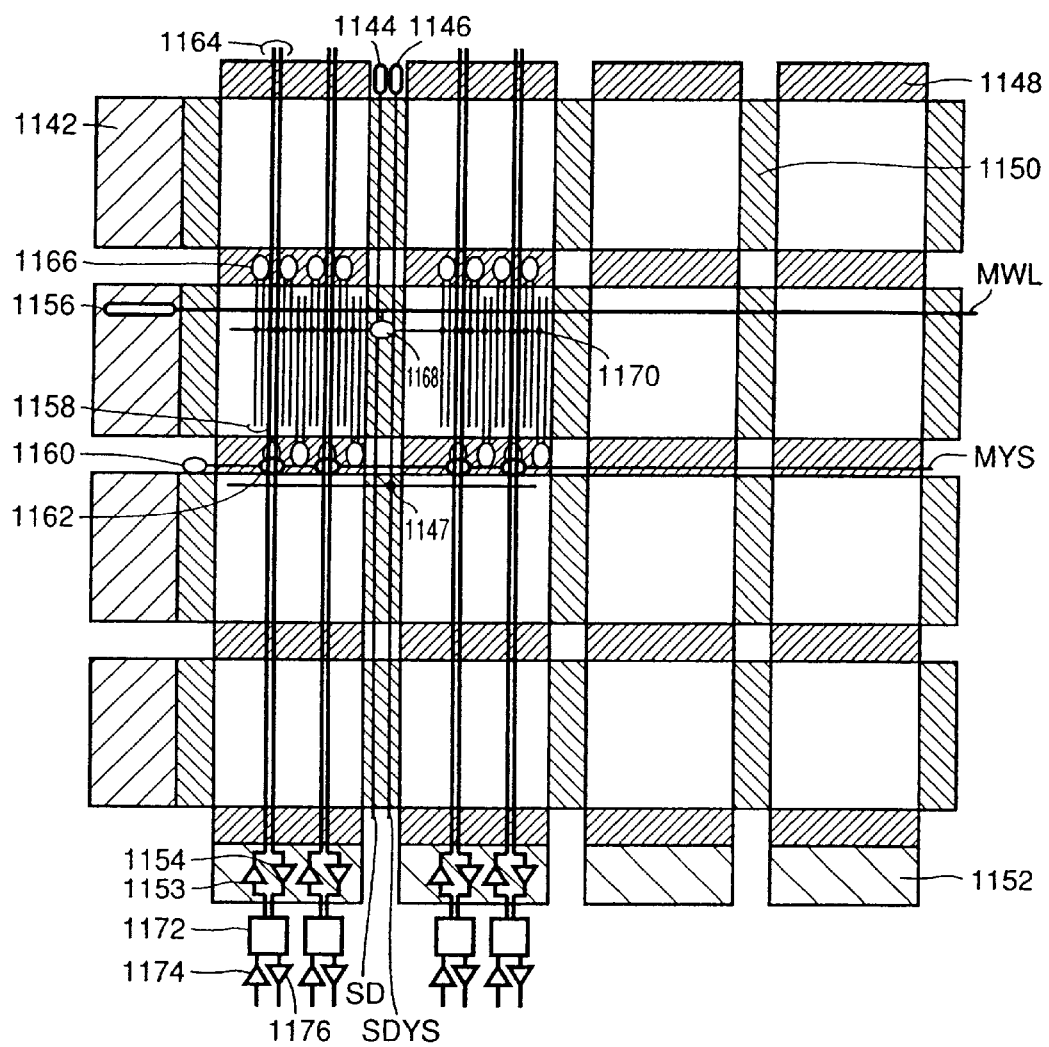
FIG. 14 is a schematic showing a structure of a memory array.

FIG. 14 is a schematic diagram showing a structure of a memory array.

Referring to FIG. 14, the memory array has memory mats arranged in a matrix of four rows and four columns. A group of main word drivers 1142 is provided correspondingly to each row and an I/O selector 1152 is provided correspondingly to each column. Each memory mat has a corresponding sense amplifier 1148 and a corresponding sub word driver 1150.

In a column-related selecting operation, a driver 1160 activates main column line selection signal MYS and an SDYS driver 1146 activates segment decode YS selection signal SDYS. These signals cause activation of sub YS signal SYS and accordingly, a corresponding I/O gate 1162 activates an I/O line 1164.

In a row-related selecting operation, a main word driver 1156 first activates a main word line MWL. An SD driver 1144 activates a segment decode line SD. Main word line MWL and segment decode line SD activate a corresponding sub word driver 1168 and then a sub word line 1170 is activated and an access transistor connected to a memory cell is turned on. Accordingly, a bit line pair 1158 outputs data and the data amplified by a sense amplifier 1166 is read via I/O line 1164. A read amplifier 1154 and a write amplifier 1153 are connected to I/O line 1164 and read amplifier 1154 and write amplifier 1153 are connected to an input/output latch 1172. Input/output latch 1172 is connected to an input buffer 1174 and an output buffer 1176 for transmitting and receiving data to and from the logic portion.

In respective examples shown in FIGS. 11, 12 and 13, input/output data-related control unit 414 is supplied with operation supply potential from supply potential VDD which is made off in the power down mode. Therefore, in self refresh in the power down mode, power supply of input/output latch 1172, input buffer 1174 and output buffer 1176 is made off. In this case, if I/O line 1164 has an unstable potential, any negative influence may be exerted on the refresh operation.

Figure 15:
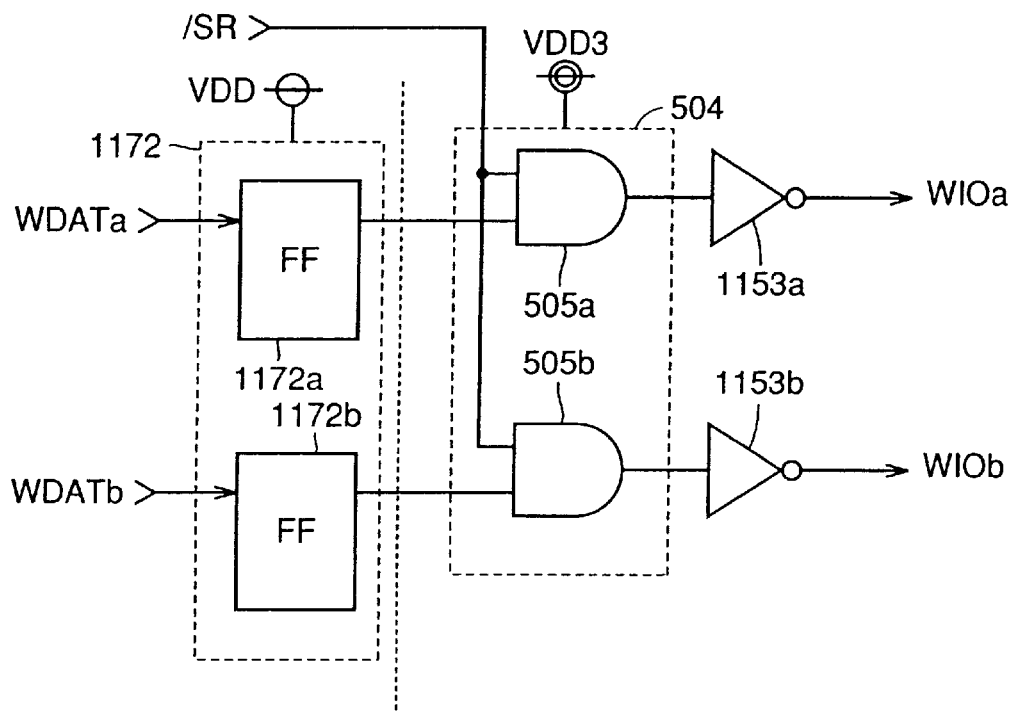
FIG. 15 illustrates a structure of a boundary portion inactivating an I/O line used for writing operation by stopping power supply.

FIG. 15 shows a structure of a boundary portion inactivating an I/O line used for writing operation, by stopping power supply.

Referring to FIG. 15, supply potential VDD is applied to latch circuit 1172. Latch circuit 1172 includes flip-flops 1172a and 1172b receiving write data signals WDATa and WDATb respectively transmitted via the input/output control unit from the logic portion.

Respective outputs of flip-flops 1172a and 1172b are input to a gate circuit 504 to which operation supply potential is applied by supply potential VDD3. Gate circuit 504 includes an AND circuit 505a receiving signal /SR which is set at L level when self refresh is carried out and an output of flip-flop 1172*a*, and an AND circuit 505*b* receiving signal /SR and an output of flip-flop 1172*b*. An output of AND circuit 505*a* is supplied to an input of inverter 1153*a* for driving a write I/O line WIOa and an output of AND circuit 505*b* is supplied to an input of inverter 1153*b* for driving a write I/O line WIOb. Such a gate circuit 504 is provided in addition to conventional components in order to set signal /SR at L level in the power down mode, and accordingly, respective outputs of AND circuits 505*a* and 505*b* are fixed at H level and then the write I/O line is fixed at H level.

Figure 16:
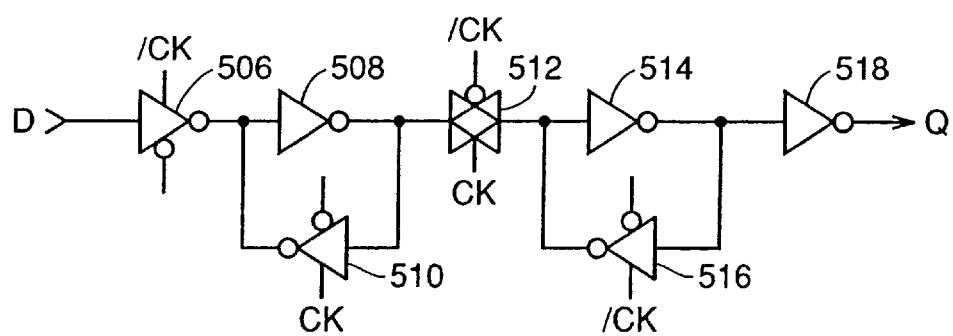
FIG. 16 is a circuit diagram showing a structure of a flip-flop 1172a in FIG. 15.

FIG. 16 is a circuit diagram showing a structure of flip-flop 1172*a* in FIG. 15.

Referring to FIG. 16, flip-flop 1172*a* includes a clocked inverter 506 activated according to clock signal /CK which is inverted when input signal D is supplied, an inverter 508 receiving and inverting an output of inverter 506, a clocked inverter 510 receiving and inverting an output of inverter 508 and activated according to clock signal CK supplied to an input portion of inverter 508, a transmission gate 512 which becomes conductive according to clock signal CK to transmit an output of inverter 508 to the next stage, an inverter 514 receiving and inverting data transmitted by transmission gate 512, a clocked inverter 516 receiving and inverting an output of inverter 514 and activated according to clock signal /CK supplied to an input portion of inverter 514, and an inverter 518 receiving and inverting an output of inverter 514 to provide output signal Q. Flip-flop 1172*b* has the same structure as that of flip-flop 1172*a* and description thereof is not repeated here.

Referring again to FIG. 15, supply potential VDD applied to latch circuit 1172 is set in off state in power down refresh mode. Even if respective outputs of flip-flops 1172*a* and 1172*b* become unstable, the write I/O line is fixed by providing gate circuit 504 and using signal /SR. Therefore, when supply potential VDD is made on again to make transition to the normal operation, the write I/O line never becomes unstable. In this way, the operation can be stabilized.

Figure 17:
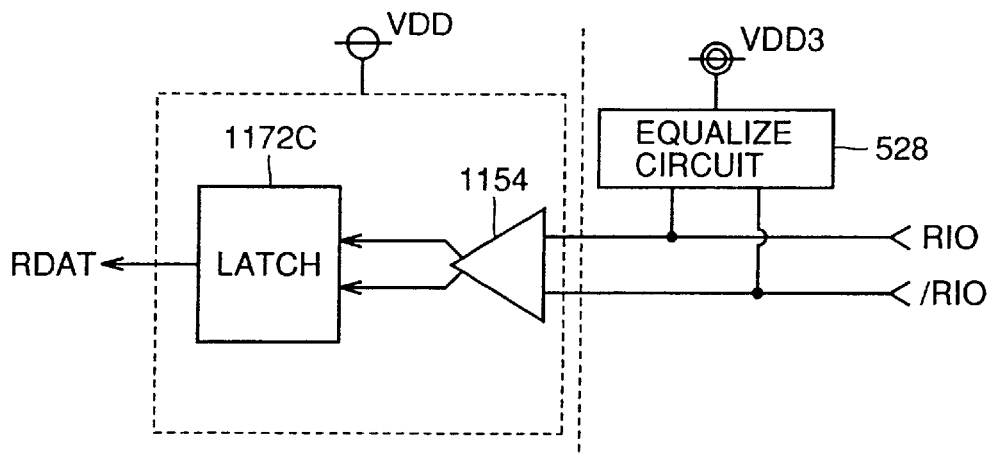
FIG. 17 illustrates that power supply is applied preceding and following a read amplifier 1154 in FIG. 14.

FIG. 17 illustrates that power supply is applied preceding and following read amplifier 1154 shown in FIG. 14.

Referring to FIG. 17, an equalize circuit 528 is connected to read I/O lines RIO and /RIO and the read I/O lines are precharged to H level before reading operation. This equalize circuit 528 is supplied with operation potential from supply potential VDD3. Data read onto read I/O lines RIO and/RIO is supplied to read amplifier 1154. Read amplifier 1154 amplifies the read data and supplies it to a latch 1172*c*. Latch 1172*c* supplies the read data RDAT to the logic portion via the input/output control unit. Read amplifier 1154 and latch 1172*c* are supplied with operation supply potential from supply potential VDD which is made off in power down refresh mode.

Figure 18:
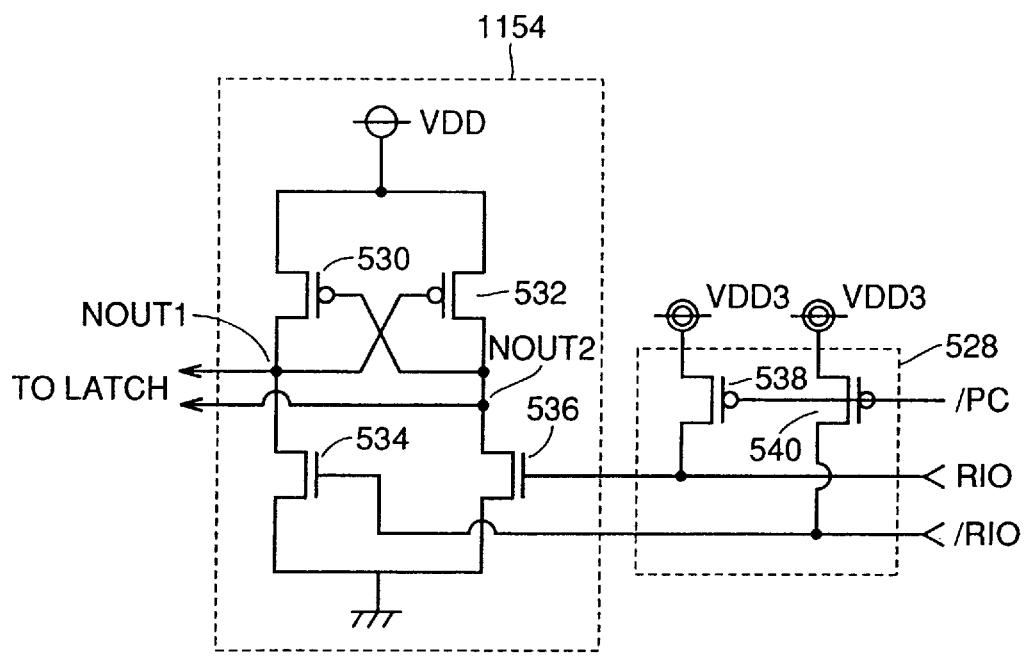
FIG. 18 is a circuit diagram showing a structure of read amplifier 1154 and an equalize circuit 528 in FIG. 17.

FIG. 18 is a circuit diagram showing a structure of read amplifier 1154 and equalize circuit 528 shown in FIG. 17.

Referring to FIG. 18, equalize circuit 528 includes P channel MOS transistors 538 and 540 for coupling respective read I/O lines RIO and /RIO to supply potential VDD3. The gates of P channel MOS transistors 538 and 540 receive precharge signal /PC.

Read amplifier 1154 includes an N channel MOS transistor 534 connected between a ground node and an output node NOUT1 and having its gate connected to read I/O line /RIO, an N channel MOS transistor 536 connected between an output node NOUT2 and the ground node and having its gate connected to read I/O line RIO, a P channel MOS transistor 532 connected between a node receiving supply potential VDD and node NOUT2 and having its gate connected to node NOUT1, and a P channel MOS transistor 530 connected between the node receiving supply potential VDD and node NOUT1 and having its gate connected to node NOUT2.

Supply potential is thus applied to the read amplifier and the equalize circuit so as to prevent any influence on data in the array even if supply potential VDD is made off in the power down refresh mode.

Figure 19:
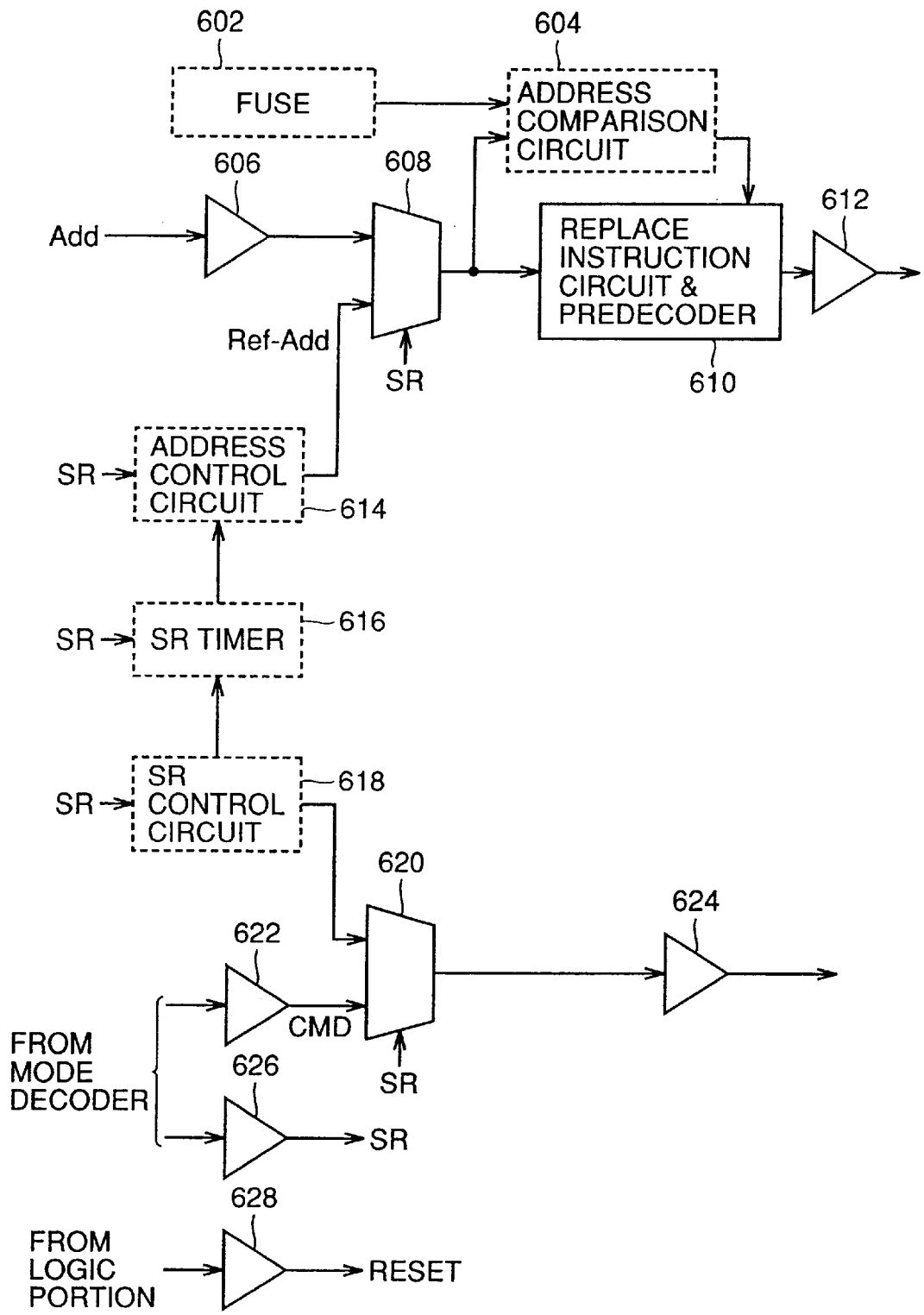
FIG. 19 is a block diagram illustrating that a transistor having a high threshold is used for a part of a block for the purpose of reducing power consumption of a refresh control-related portion.

FIG. 19 is a block diagram illustrating that a transistor having a high threshold is employed in some blocks for the purpose of reducing power consumption in the refresh control-related portion.

Referring to FIG. 19, when the self refresh mode is set by the mode decoder, a buffer 626 activates self refresh signal SR. Accordingly, an address control circuit 614, an SR timer 616 and an SR control circuit 618 start respective operations. Usually address signal Add is supplied to a buffer 606 and an output of buffer 606 and a refresh address Ref/Add output from address control circuit 614 are supplied to a multiplexer 608. Multiplexer 608 outputs a refresh address signal when self refresh signal SR is activated. An output of multiplexer 608 is supplied to an address comparison circuit 604 and a replace instruction circuit and predecoder 610. Address comparison circuit 604 compares a replace address signal set by a fuse 602 with an input address signal and issues a replace instruction to replace instruction circuit and predecoder 610 when these addresses match each other. Replace instruction circuit and predecoder 610 outputs result of decoding to a buffer 612 and buffer 612 outputs array select information to the memory array.

A path through which a command signal is transmitted is now described. A selection circuit 620 receives command signal CMD from the mode decoder via a buffer 622 in the normal operation. Selection circuit 620 receives a command signal from SR control circuit 618 at the other input in the self refresh. Selection circuit 620 outputs any of the command signals to a buffer 624 according to self refresh signal SR, and buffer 624 transmits the command signal to the array. A buffer 628 is further provided for transmitting a reset signal from the logic portion.

In the example of the structure shown in FIG. 19, the circuit portion which should operate at a high speed needs a transistor having a low threshold voltage. In the self refresh, another circuit constituted of a transistor having a high threshold voltage different from the normal circuit is activated. The reason is that no high speed reading operation like that in the normal operation is required in the self refresh. Signals required for refresh may be only those for inactivation of an equalize signal, activation of a word line and activation of a sense amplifier. For example, in FIG. 19, address control circuit 614, SR timer 616 and SR control circuit 618 are constituted by using transistors having a high threshold voltage. Similarly, fuse 602 and address comparison circuit 604 are constituted by transistors having a high threshold voltage operating with supply voltage of 3.3 V and having a thick gate oxide film.

It is noted that multiplexers 608 and 620 and buffers 626 and 628 are constituted of transistors having a thick gate oxide film and operate with supply voltage of 1.5 V.

Figure 20:
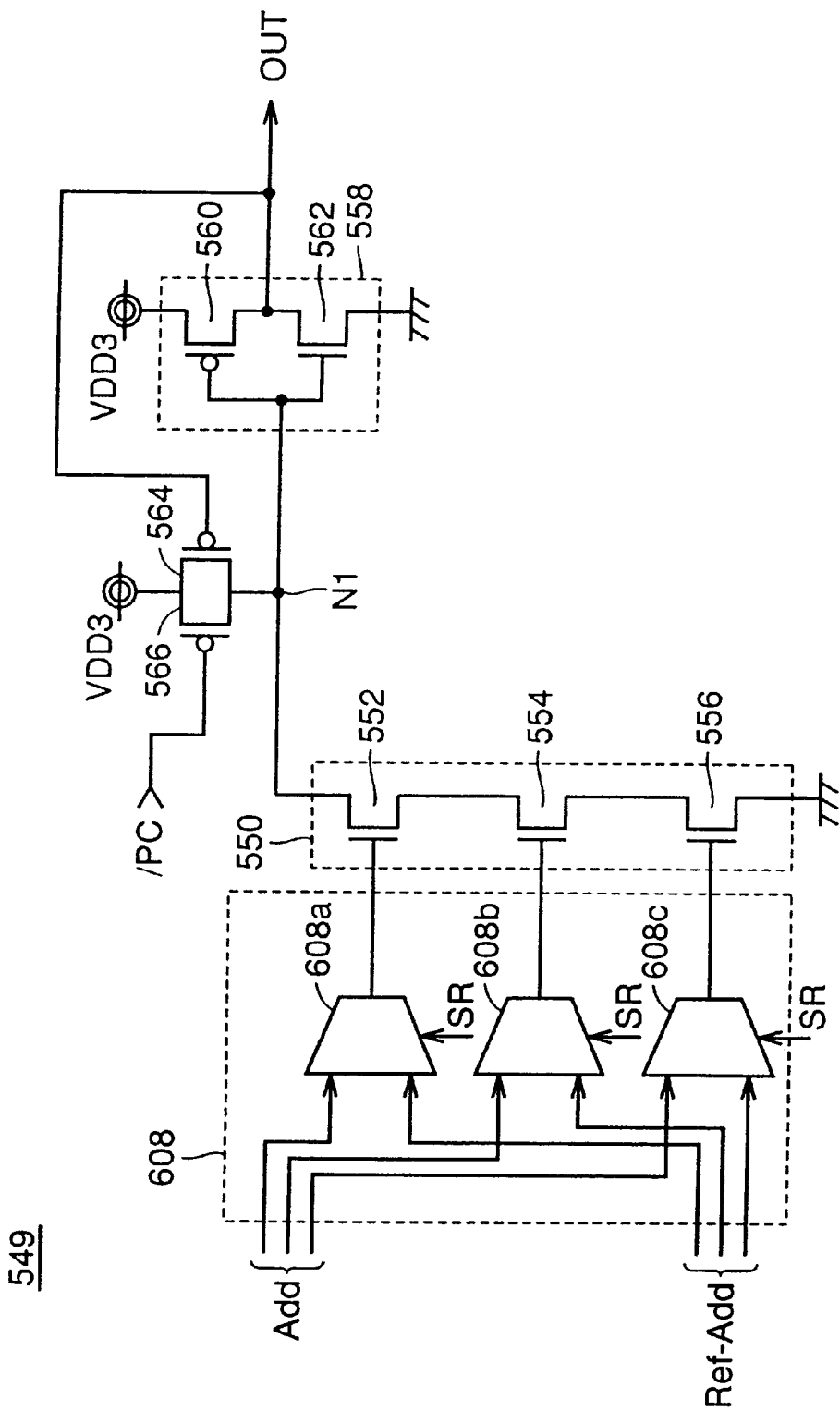
FIG. 20 is a circuit diagram showing a circuit structure for multiplexing an address in a normal operation and an address in a self refresh.

FIG. 20 is a circuit diagram showing a first example of a circuit structure for multiplexing an address in the normal operation and an address in the self refresh.

Referring to FIG. 20, address signal Add supplied in the normal operation and refresh address signal Ref-Add supplied in the self refresh mode are input to multiplexer 608 in FIG. 19. Multiplexer 608 includes multiplexers 608a–608c for multiplexing bits of address signal Add and refresh address signal Ref-Add. These multiplexers select an address signal according to self refresh signal SR and output the selected address signal to a decode unit 550. Decode unit 550 includes N channel MOS transistors 552–556 connected in series between a node N1 and a ground node. Respective outputs of multiplexers 608a–608c are supplied to respective gates of N channel MOS transistors 552–556. Node N1 is coupled to supply potential VDD3 by a P channel MOS transistor 566 according to precharge signal /PC. The potential on node N1 is inverted by an inverter 558 to be output as output signal OUT. Signal OUT is supplied to the gate of a P channel MOS transistor 564 connected between node N1 and a node to which supply potential VDD3 is applied.

Inverter 558 includes a P channel MOS transistor 560 and an N channel MOS transistor 562 connected in series between the node to which supply potential VDD3 is supplied and the ground node. The gates of P channel MOS transistor 560 and N channel MOS transistor 562 are both connected to node N1 and output signal OUT is supplied from a connection node between P channel MOS transistor 560 and N channel MOS transistor 562.

Figure 21:
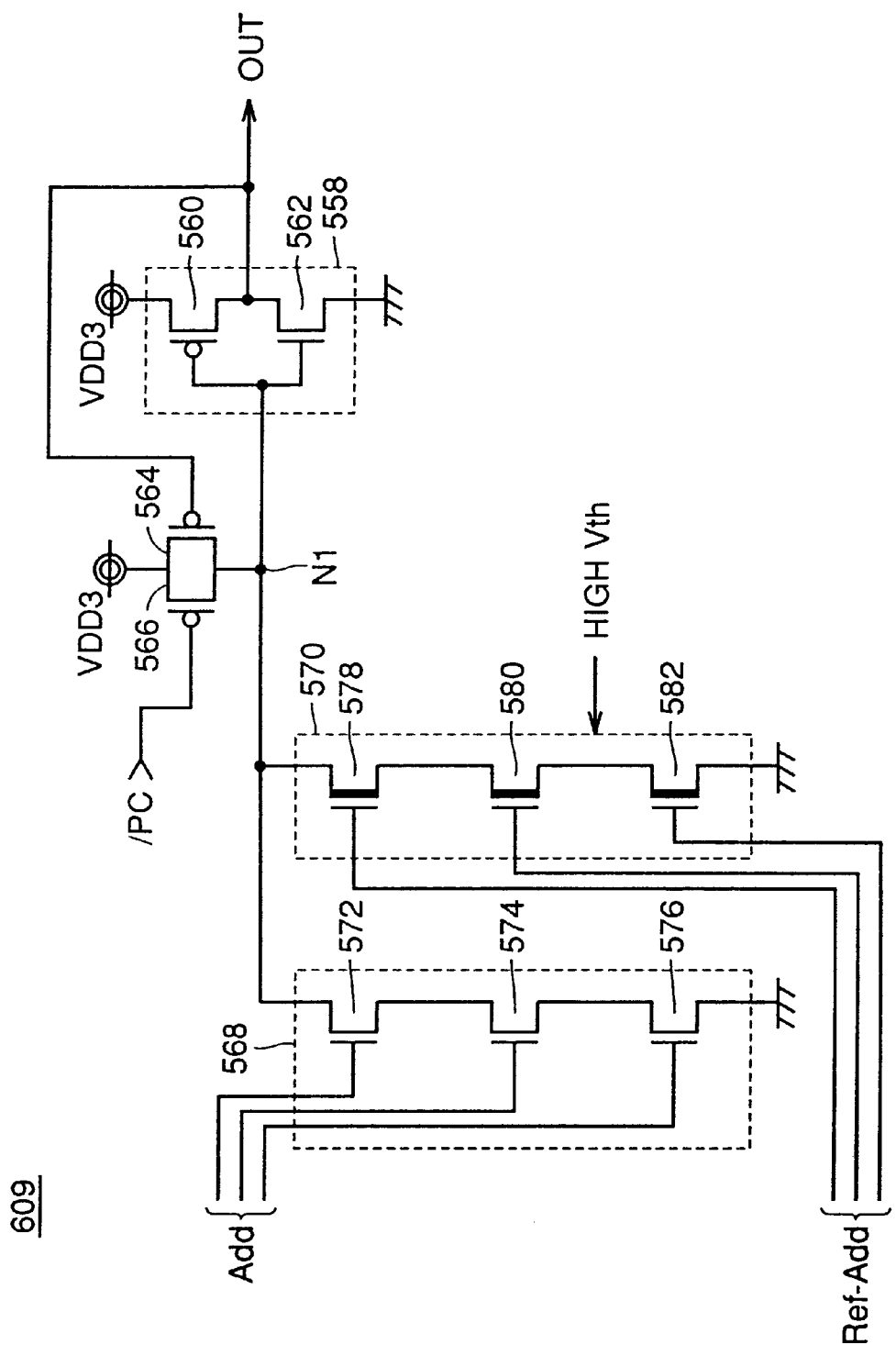
FIG. 21 is a circuit diagram showing a second structure for multiplexing addresses.

FIG. 21 is a circuit diagram showing a second example of a structure for address multiplexing.

Referring to FIG. 21, a circuit 609 in the second example includes decode units 568 and 570 instead of multiplexer 608 and decode unit 550 in structure 549 of the first example. Other components are similar to those in the example of circuit 549 and description thereof is not repeated here. Decode unit 568 includes N channel MOS transistors 572–576 having respective gates receiving address signal Add in the normal operation and connected in series between node N1 and the ground node.

Decode unit 570 includes N channel MOS transistors 578–582 having respective gates receiving refresh address Ref-Add in the refresh and connected in series between node N1 and the ground node. In the normal operation, each bit of refresh address Ref-Add is set at L level. In the self refresh mode, each bit of normal address signal Add is fixed at L level. In this structure, an N channel MOS transistor having a high threshold voltage Vth is employed in decode unit 570 so as to reduce leakage current in the power down mode.

For operational switching from decode unit 568 to decode unit 570, decode unit 568 should be set in a non-operating state. In this case, it is not necessarily required to set all address bits of address signals Add at L level. Any address which always fixed at L level in the self refresh may be supplied to one of transistors 572–576. Similarly, in order not to operate decode unit 570 in the normal operation, any address which is always fixed at L level in the normal operation may be supplied to any of transistors 578–582.

A circuit structure employed for transmitting a command signal to a memory array when a plurality of supply potentials are present as shown in FIG. 19 is described.

Figure 22:
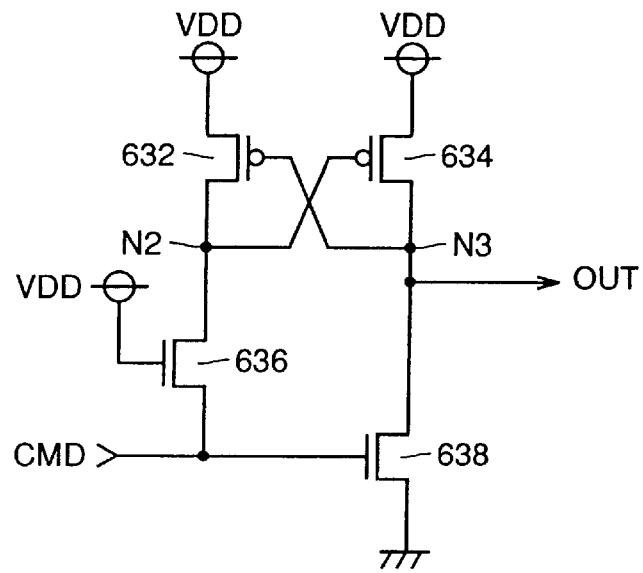
FIG. 22 is a circuit diagram showing a structure of a level converting circuit.

FIG. 22 is a circuit diagram showing a structure of a level conversion circuit.

Referring to FIG. 22, the level conversion circuit includes an N channel MOS transistor 638 connected between a node N3 and a ground node and having its gate receiving command signal CMD, an N channel MOS transistor 636 connected between a node N2 and the gate of N channel MOS transistor 638 and having its gate receiving supply potential VDD, a P channel MOS transistor 632 connected between node N2 and a node receiving supply potential VDD and having its gate connected to node N3, and a P channel MOS transistor 634 connected between the node receiving supply potential VDD and node N3 and having its gate connected to node N2. From node N3, output signal OUT is supplied.

By such a structure, an output amplitude of command signal CMD is converted to an amplitude between ground potential and supply potential VDD.

Figure 23:
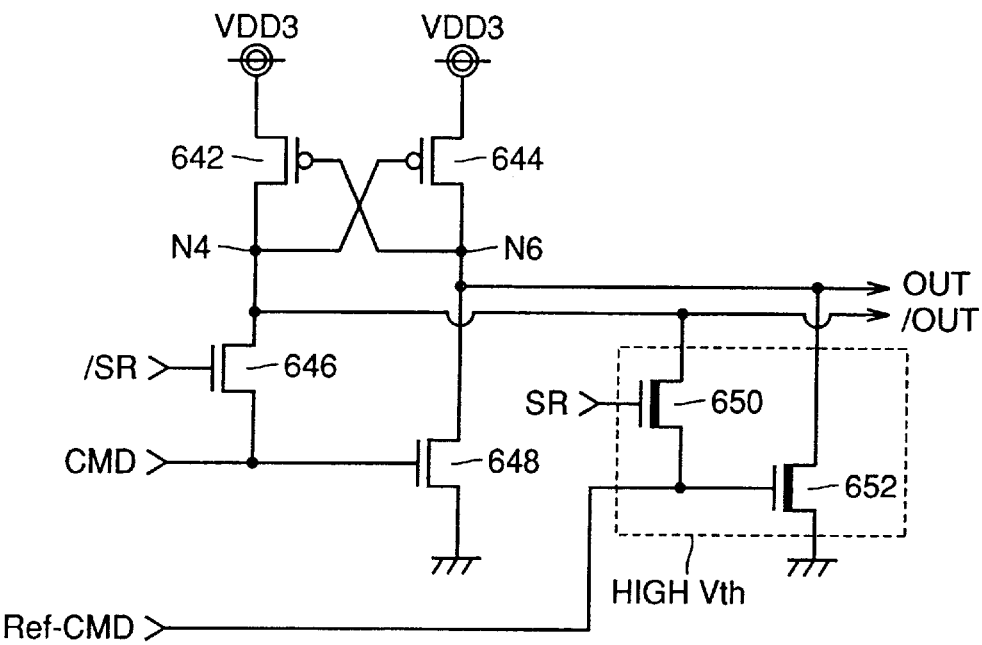
FIG. 23 is a circuit diagram showing a structure of a selection circuit 620 in FIG. 21.

FIG. 23 is a circuit diagram showing a structure of selection circuit 620 in FIG. 21.

Referring to FIG. 23, selection circuit 620 includes an N channel MOS transistor 648 connected between a node N6 and the ground node and having its gate receiving command signal CMD, an N channel MOS transistor 646 connected between a node N4 and the gate of N channel MOS transistor 648 and having its gate receiving inversion signal /SR of a self refresh signal, a P channel MOS transistor 642 connected between node N4 and a node receiving supply potential VDD3 and having its gate connected to node N6, and a P channel MOS transistor 644 connected between the node receiving supply potential VDD3 and node N6 and having its gate connected to node N4. Output signal OUT is supplied from node N6 and output signal /OUT is supplied from node N4.

Selection circuit 620 further includes an N channel MOS transistor 652 connected between the ground node and node N6 and having its gate receiving command signal Ref-CMD in the refresh, and an N channel MOS transistor 650 connected between node N4 and the gate of N channel MOS transistor 652 and having its gate receiving self refresh signal SR. Since N channel MOS transistors 650 and 652 operate only in the self refresh mode, higher speed than that in the normal operation is unnecessary. Therefore, an N channel MOS transistor having a high threshold voltage and low leakage current is employed. By such a structure, leakage current in the self refresh can be reduced and power consumption of the chip can further be decreased.

A structure for converting the level of a signal to transmit it between circuits having a plurality of supply potentials is now described.

Figure 24:
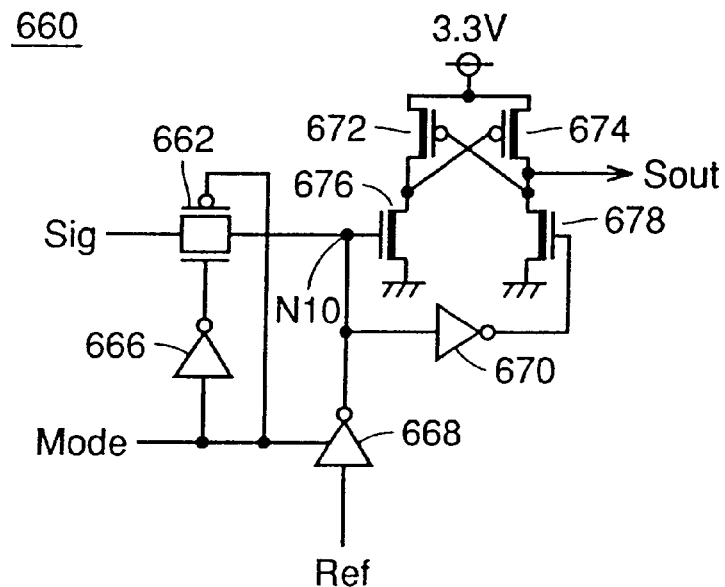
FIG. 24 is a circuit diagram showing a structure of a first level converting circuit 660 for level converting from 1.5V to 3.3V.

FIG. 24 is a circuit diagram showing a structure of a first level conversion circuit 660 for converting the level from 1.5V to 3.3V.

Referring to FIG. 24, level conversion circuit 660 includes an inverter 666 receiving and inverting a mode signal, a transmission gate 662 which becomes conductive according to an output of inverter 666 to transmit signal Sig supplied in the normal operation to a node N10, a clocked inverter 668 activated by mode signal Mode, receiving signal Ref in the refresh and inverting it, an inverter 670 having its input connected to node N10, a P channel MOS transistor 672 and an N channel MOS transistor 676 connected in series between a node receiving supply potential of 3.3V and the ground node, and a P channel MOS transistor 674 and an N channel MOS transistor 678 connected in series between the node receiving supply potential of 3.3V and the ground node. The gate of N channel MOS transistor 676 is connected to node N10. The gate of N channel MOS transistor 678 receives an output of inverter 670. An output of P channel MOS transistor 672 is connected to a connection node between P channel MOS transistor 674 and N channel MOS transistor 678. The gate of P channel MOS transistor 674 is connected to a connection node between P channel MOS transistor 672 and N channel MOS transistor 676. An output signal Sout is supplied from the connection node between P channel MOS transistor 674 and N channel MOS transistor 678.

Level conversion circuit 660 employs as transistors 672–678 MOS transistors having a high threshold voltage. Therefore, leakage current in the refresh mode is set small in this portion. MOS transistors having a low threshold voltage are employed as other transistors and inverters. Such a structure uses the minimum number of transistors to carry out the conversion.

Figure 25:
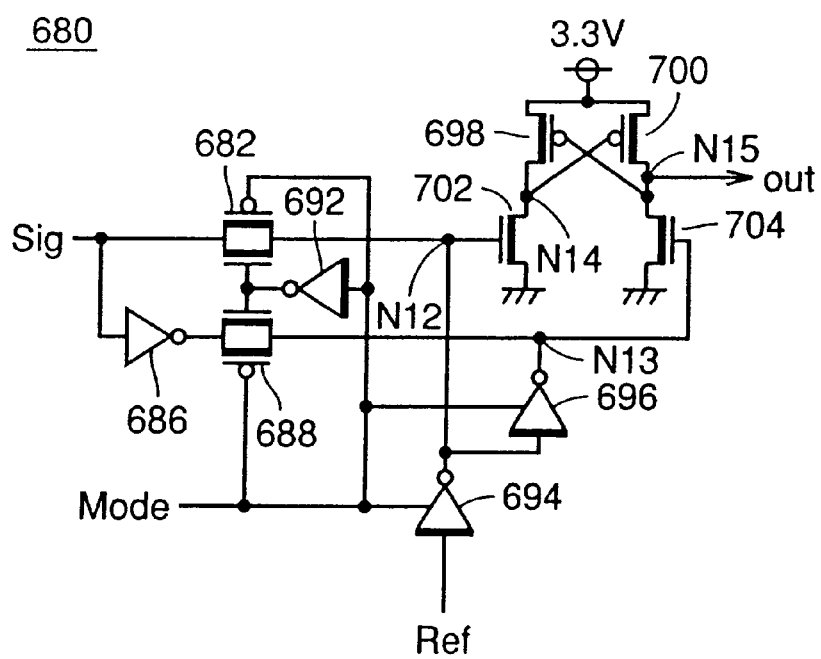
FIG. 25 is a circuit diagram showing a structure of a level converting circuit 680 as a second example of level conversion.

FIG. 25 is a circuit diagram showing a structure of a level conversion circuit 680 as a second example.

Referring to FIG. 25, level conversion circuit 680 includes an inverter 686 receiving and inverting signal Sig, an inverter 692 receiving and inverting mode signal Mode, and clocked inverters 694 and 696 connected in series, activated according to mode signal Mode and receiving signal Ref. An output of clocked inverter 694 is connected to a node N12 and an output of clocked inverter 696 is connected to a node N13.

Level conversion circuit 680 further includes a transmission gate 682 which becomes conductive when mode signal Mode is at L level to transmit signal Sig to node N12, and a transmission gate 688 which becomes conductive when mode signal Mode is at L level to transmit an output of inverter 686 to node N13.

Level conversion circuit 680 further includes an N channel MOS transistor 702 connected between a node N14 and the ground node and having its gate connected to node N12, an N channel MOS transistor 704 connected between a node N15 and the ground node and having its gate connected to node N13, a P channel MOS transistor 698 connected between a supply node receiving 3.3V and node N14 and having its gate connected to node N15, and a P channel MOS transistor 700 connected between the node receiving supply potential of 3.3V and node N15 and having its gate connected to node N14.

In the structure of level conversion circuit 680, input-related circuits associated with the transmission gate and signal Ref are constituted by transistors having a high threshold voltage controlled by 3.3V. Compared with level conversion circuit 660 shown in FIG. 24, the number of transistors increases and the speed becomes a little lower. However, the gate potential of transmission gates 682 and 688 is controlled by 3.3V. Therefore, it is not necessary to supply a signal having an amplitude of 1.5V and power source of any circuitry operating with supply potential of 1.5V may be made off.

Figure 26:
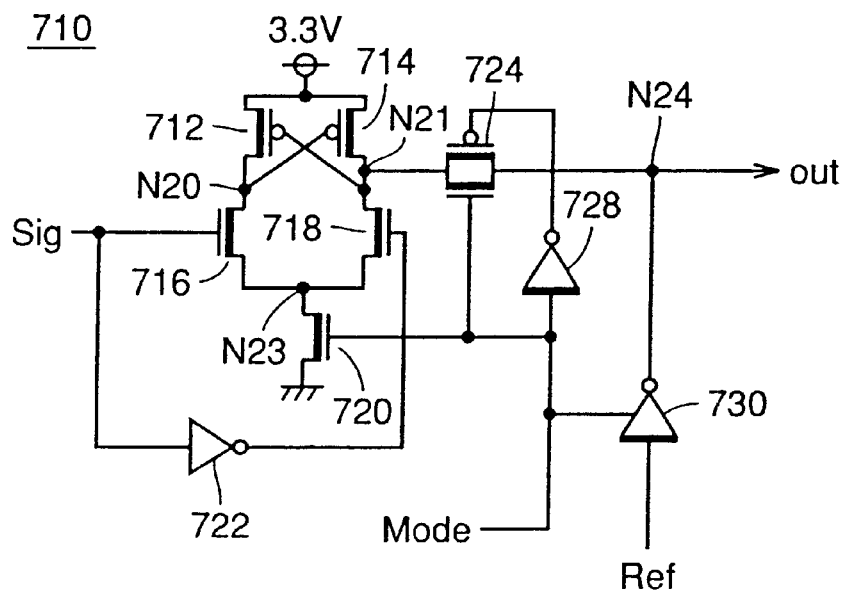
FIG. 26 is a circuit diagram showing a structure of a level converting circuit 710 as a third example of level conversion.

FIG. 26 is a circuit diagram showing a structure of a level conversion circuit 710 as a third example of the level conversion circuit.

Referring to FIG. 26, level conversion circuit 710 includes an inverter 722 receiving and inverting signal Sig, an N channel MOS transistor 720 connected between a node N23 and the ground node and having its gate receiving mode signal Mode, an N channel MOS transistor 716 connected between a node N20 and node N23 and having its gate receiving signal Sig, an N channel MOS transistor 718 connected between nodes N21 and N23 and having its gate receiving an output of inverter 722, a P channel MOS transistor 712 connected between node N20 and a supply node receiving 3.3V and having its gate connected to node N21, and a P channel MOS transistor 714 connected between the supply node receiving 3.3V and node N21 and having its gate connected to node N20.

Level conversion circuit 710 further includes an inverter 728 receiving and inverting mode signal Mode, a clocked inverter 730 activated according to mode signal Mode and receiving and inverting signal Ref, and a transmission gate 724 for coupling nodes N21 and N24 according to the mode signal and an output of inverter 728.

Level conversion circuit 710 is constituted of transistors having a high threshold voltage except for inverter 722. Level conversion circuit 710 is different from level conversion circuit 680 in FIG. 25 in that signal Sig applied with the amplitude of 1.5V is level-converted and thereafter the resultant signal is multiplexed with signal Ref supplied in the refresh.

Level conversion circuit 710 can be constituted with a reduced number of transistors compared with level conversion circuit 680.

A structure concerning control of a column selection line is now described. The column selection line becomes a floating state when 1.5V-related power supply is made off. Therefore, the potential should be fixed.

Figure 27:
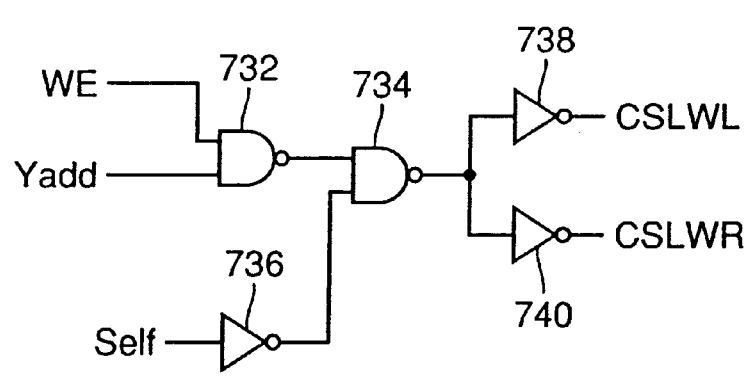
FIG. 27 is a circuit diagram showing a structure of a column selection line fixing circuit 730.

FIG. 27 is a circuit diagram showing a structure of a column selection line fixing circuit 730.

Referring to FIG. 27, column selection line fixing circuit 730 includes a NAND circuit 732 receiving write enable signal WE and address signal Yadd, an inverter 736 receiving and inverting signal Self set at H level in the self refresh mode, a NAND circuit 734 receiving respective outputs of NAND circuit 732 and inverter 736, an inverter 738 receiving and inverting an output of NAND circuit 734 and having its output connected to a write column selection line CSLWL, and an inverter 740 receiving an output of NAND circuit 734 and having its output connected to a write column selection line CSLWR.

Column selection line fixing circuit 730 is constituted of transistors all having a low threshold voltage and operating with 1.5V. In the self refresh, signal Self is at H level. Therefore, an output of NAND circuit 734 is fixed at H level and accordingly both of write column selection lines CSLWL and CSLWR are fixed at L level.

Figure 28:
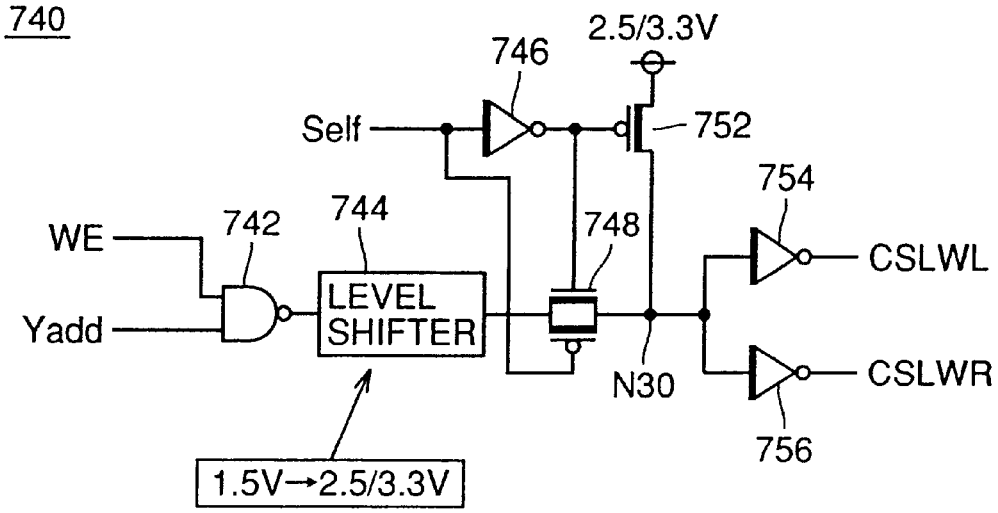
FIG. 28 is a circuit diagram showing a structure of a column selection line fixing circuit 740 as a second example for fixing a column selection line.

FIG. 28 is a circuit diagram showing a structure of a column selection line fixing circuit 740 as the second example of a structure for fixing a column selection line.

Referring to FIG. 28, column selection line fixing circuit 740 includes a NAND circuit 742 receiving write enable signal WE and address signal Yadd, a level shifter 744 converting an output of NAND circuit 742 from the amplitude of 1.5V to the amplitude of 2.5V or 3.3V, an inverter 746 receiving and inverting signal Self, a transmission gate 748 which becomes conductive according to inverter 746 and signal Self to transmit an output of level shifter 744 to a node N30, a P channel MOS transistor 752 receiving an output of inverter 746 at its gate for coupling node N30 to supply potential of 2.5V or 3.3V, an inverter 754 having its input connected to node N30 and its output connected to write column selection line CSLWL, and an inverter 756 having its input connected to node N30 and its output connected to column selection line CSLWR.

Column selection line fixing circuit 740 is employed when the column selection line operates with 2.5V or 3.3V. As a transmission gate, a transistor having a high threshold voltage is employed. Precharge operation of 2.5V/3.3V is carried out by P channel MOS transistor 752 having a high threshold voltage. In the self refresh mode, signal Self is activated to H level and accordingly P channel MOS transistor 752 is turned on and transmission gate 748 becomes nonconductive. Node N30 is then fixed at H level and accordingly both of column selection lines CSLWL and CSLWR are fixed at H level. In such a structure, NAND circuit 742 with its power source set in the off state and the level shifter 744 are separated by node N30 and transmission gate 748. Then noise of the column selection line can be reduced.

Figure 29:
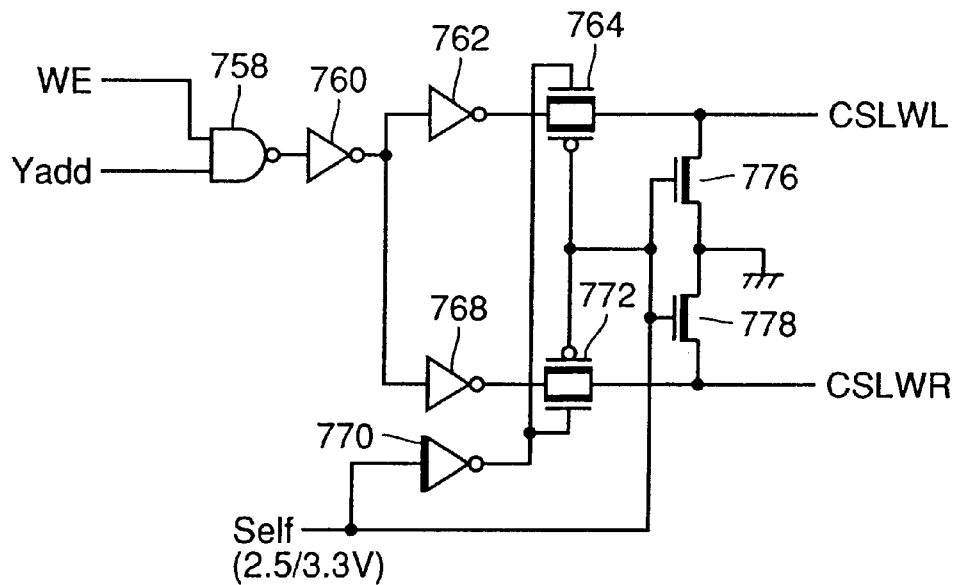
FIG. 29 is a circuit diagram showing a structure of a column selection line fixing circuit 757 as a third example for fixing a column selection line.

FIG. 29 is a circuit diagram showing a structure of a column selection line fixing circuit 757 as a third example of the structure for fixing the column selection line.

Referring to FIG. 29, column selection line fixing circuit 757 includes a NAND circuit 758 receiving write enable signal WE and address signal Yadd, an inverter 760 receiving and inverting an output of NAND circuit 758, an inverter 762 receiving and inverting an output of inverter 760, an inverter 768 receiving and inverting an output of inverter 760, an inverter 770 receiving and inverting signal Self which is at H level in the self refresh, a transmission gate 764 which becomes conductive according to inverter 770 and signal Self to transmit an output of inverter 762 to write column selection line CSLWL, a transmission gate 772 which becomes conductive according to an output of inverter 770 and signal Self to transmit an output of inverter 768 to write column selection line CSLWR, and N channel MOS transistors 766 and 778 having the gate receiving signal SELF for fixing respective write column selection lines CSLWL and CSLWR at ground potential in the self refresh mode.

Compared with column selection line fixing circuit 740 shown in FIG. 28, column selection line fixing circuit 757 enables further reduction of a slight amount of through current or leakage current of driver circuits or inverters 754 and 756 for driving the column selection line. In other words, the power supply of inverters 762 and 768 as the driver circuits can be made off and transmission gates 764 and 772 separate respective outputs of inverters 762 and 768 from column selection lines CSLVWL and CSLWR. In this way, leakage current of the driver circuit can be eliminated when the column selection line is fixed at L level.

In order to reduce the leakage current, various structures are employed as described above. In this way, power supply of the peripheral circuit of the DRAM portion in the system LSI can be made off. Further, in the circuit having its power source in the on state, the leakage current can be decreased.

Third Embodiment

Figure 30:
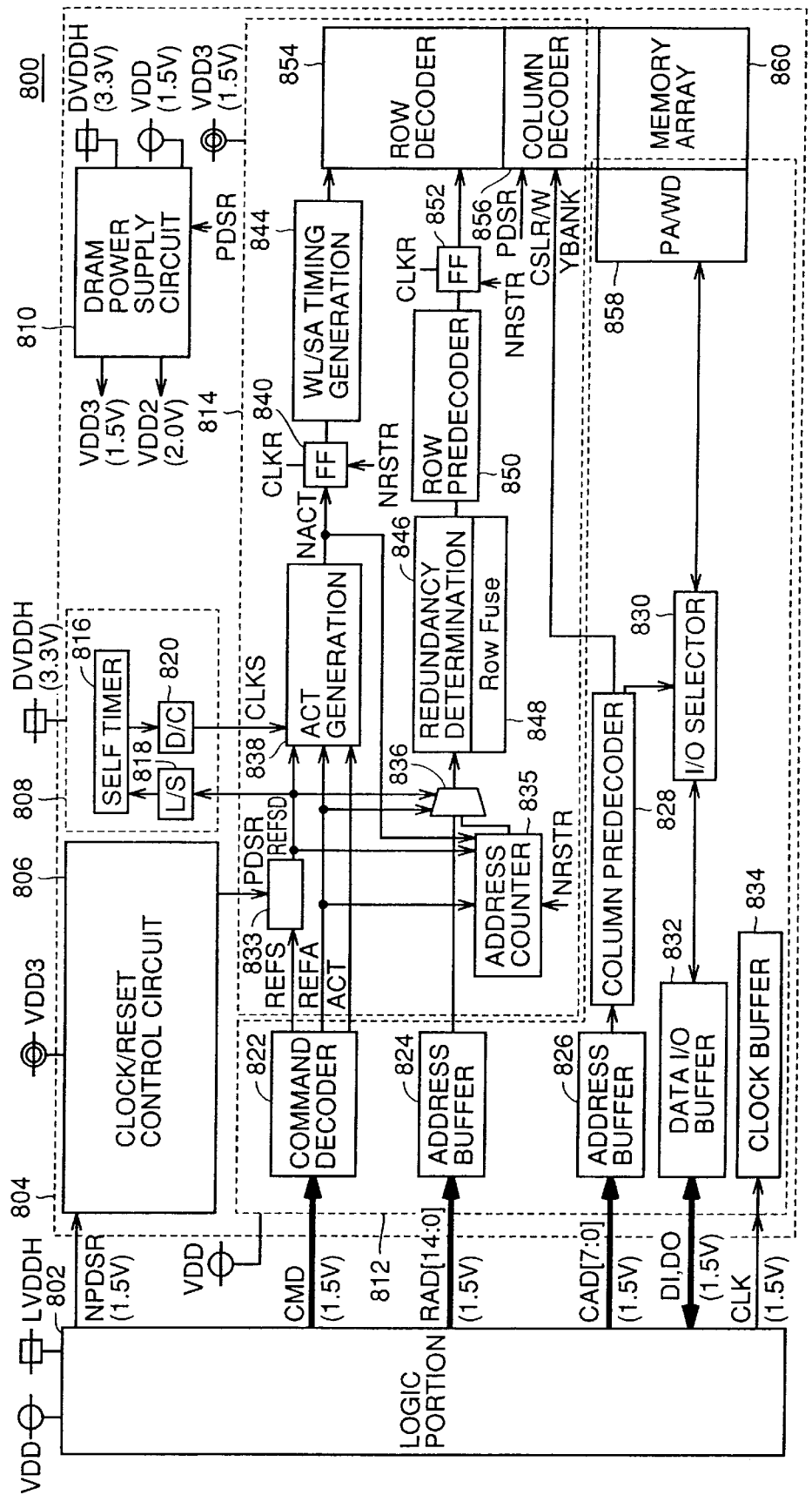
FIG. 30 is a block diagram showing a structure of a semiconductor device 800 according to a third embodiment.

FIG. 30 is a block diagram showing a structure of a semiconductor device 800 according to the third embodiment.

Referring to FIG. 30, semiconductor device 800 includes a logic portion 802 transmitting and receiving data to and from the outside and performing various arithmetic operations and the like, and a DRAM portion 804 receiving from logic portion 802 a command signal and an address signal and transmitting and receiving data to and from logic portion 802. DRAM portion 804 includes a clock/reset control circuit 806 receiving signal NPDSR from the logic portion and outputting power down mode signal PDSR and making various reset controls, a peripheral circuit 812 receiving a command signal and an address signal from logic portion 802, a peripheral circuit 814 receiving an internal command signal and an internal address signal and the like from peripheral circuit 812 to perform row-related processing, a self refresh control circuit 808 outputting clock signal CLKS to peripheral circuit 314 in the self refresh mode, a DRAM power supply circuit 810 receiving externally provided supply potential of 3.3V and supply potential VDD of 1.5V to output 1.5V supply potential VDD3 and 2.0V supply potential VDD2 to a memory array, and memory array 860 in which reading of data is controlled by peripheral circuits 814 and 812.

Peripheral circuit 812 includes a command decoder 822 receiving command signal CMD from the logic portion with the amplitude of 1.5V, an address buffer 824 receiving row address signal RAD [14:0] from logic portion 802 with an amplitude of 1.5V, an address buffer 826 receiving column address signal CAD [7:0] from logic portion 802 with an amplitude of 1.5V, a column predecoder 828 predecoding an output of address buffer 826, and a clock buffer 834 receiving 1.5V amplitude clock signal CLK from logic portion 802 to supply it to any circuit of DRAM portion 804.

Peripheral circuit 812 further includes a preamplifier/write driver 858 reading data from memory array 860 or writing data into memory array 860, and an I/O selector 830 transmitting and receiving data to and from preamplifier/write driver 858 and selectively connecting it with a data input/output buffer according to an output of column decoder 828. Data input/output buffer 832 transmits and receives data input signal DI and data output signal DO to and from logic portion 802 with an amplitude of 1.5V.

Peripheral circuit 814 includes a selection circuit 833 receiving self refresh command REFS from command decoder 822 and receiving power down self refresh signal PDSR from clock/reset control circuit 806 and activate signal REFSD according to any of them, an ACT generating circuit 838 receiving signal REFSD and refresh command REFA and row active command ACT from command decoder 822 and outputting row-related activation signal NACT, a flip-flop 840 receiving signal NACT synchronously with clock signal CLKR after reset according to reset signal NRSTR to latch the received signal, and a timing generating circuit 844 outputting a timing signal for activating a word line and a sense amplifier according to an output of flip-flop 840.

Peripheral circuit 814 further includes an address counter 835 outputting a refresh address according to refresh command REFA, signal REFSD, and row-related activation signal NANCT, a selection circuit 836 transmitting an output of address counter 835 to the inside as an address signal in the refresh and transmitting an output of address buffer 824 to the inside in the normal operation, a row-related fuse 848 where a redundancy replace address is set, a redundancy determination circuit 846 comparing the redundancy replace address with an address supplied from selection circuit 836 to make judgement of redundancy replace, a row predecoder 850 predecoding an output of redundancy determination circuit 846, and a flip-flop 852 taking an output of row predecoder 850 synchronously with clock signal CLKR to supply it to row decoder 846 after reset by reset signal NRSTR.

Peripheral circuit 814 further includes a row decoder 854 for performing row-related decode processing for selecting a memory cell of memory array 860, and a column decoder 856 receiving an output of column predecoder 828 to make column-related selection. In the power down mode, column decoder 856 is structured to fix potentials of read and write selection lines CSLR/W by signal PDSR.

Refresh control circuit 808 includes a level shift circuit 818 receiving signal REFSD and performing level shift, a self timer 816 activated according to an output of level shift circuit 818, generating a clock signal by a ring oscillator included inside, and outputting a reference clock for self refresh using the generated clock signal as a reference, and a down converter 820 receiving an output of self timer 816 to convert it to the one having a low level amplitude. An output of down converter 820 is supplied as clock signal CLKS to ACT generating circuit 838 which outputs row-related activation pulse.

Power supply provided to semiconductor device 800 is now described. VDDH is supply potential of 3.3V supplied from the outside. Supply potential VDD is an externally applied supply potential of 1.5V. The logic portion receives supply potentials VDDH and VDD to carry out internal operation. A clock reset control circuit and peripheral circuit 814 receive as operation supply potential, 1.5V supply potential VDD3 from DRAM power supply circuit 810.

Peripheral circuit 812 receives supply potential VDD as its operational supply potential.

Figure 31:
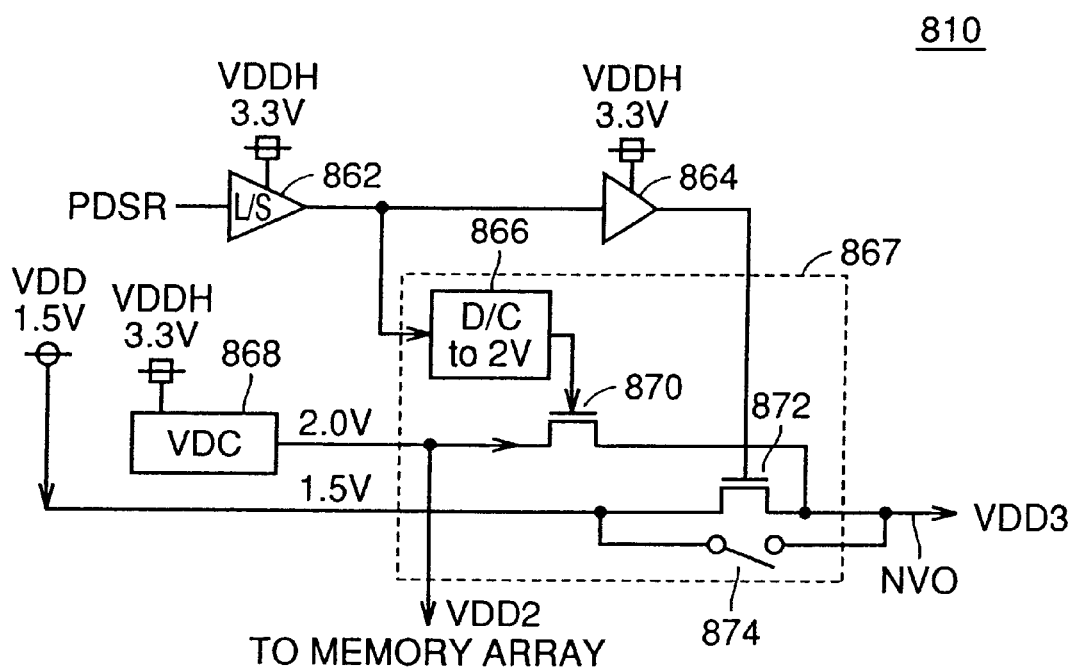
FIG. 31 is a circuit diagram showing a structure of a DRAM power supply circuit 810 in FIG. 30.

FIG. 31 is a circuit diagram showing a structure of DRAM power supply circuit 810 in FIG. 30.

Referring to FIG. 31, DRAM power supply circuit 810 includes a level shifter 862 converting the level of the power down self refresh signal to 3.3V, a buffer circuit 864 driven by power supply of 3.3V and buffering an output of level shifter 862, a down converter 866 converting the voltage of an output of level shifter 862 to 2V, a voltage down converter circuit 868 receiving 3.3V supply potential VDDH and outputting 2.0V supply potential VDD2, an N channel MOS transistor 872 turned on in the normal operation mode to transmit externally provided 1.5V supply potential VDD to an output node NVO, and an N channel MOS transistor 870 turned on in the power down mode to transmit an output of voltage down converter circuit 868 to output node NVO. From output node NVO, supply potential VDD3 is output as an output of DRAM supply circuit 810. Supply potential VDD2 is an output of voltage down converter circuit 868 and applied to a memory array.

The gate potential of N channel MOS transistor 870 is set at 2V in the power down mode. Voltage drop corresponding to almost threshold voltage is generated by N channel MOS transistor 870 and supply potential VDD3 is set at approximately 1.5V in the power down mode.

A switch 874 is provided for allowing coupling between the node receiving external supply potential VDD and output node NVO when the power down mode is unnecessary. Switch 874 may be set selectively in the conductive state by changing a metal mask in a manufacturing process of a semiconductor device.

Figure 32:
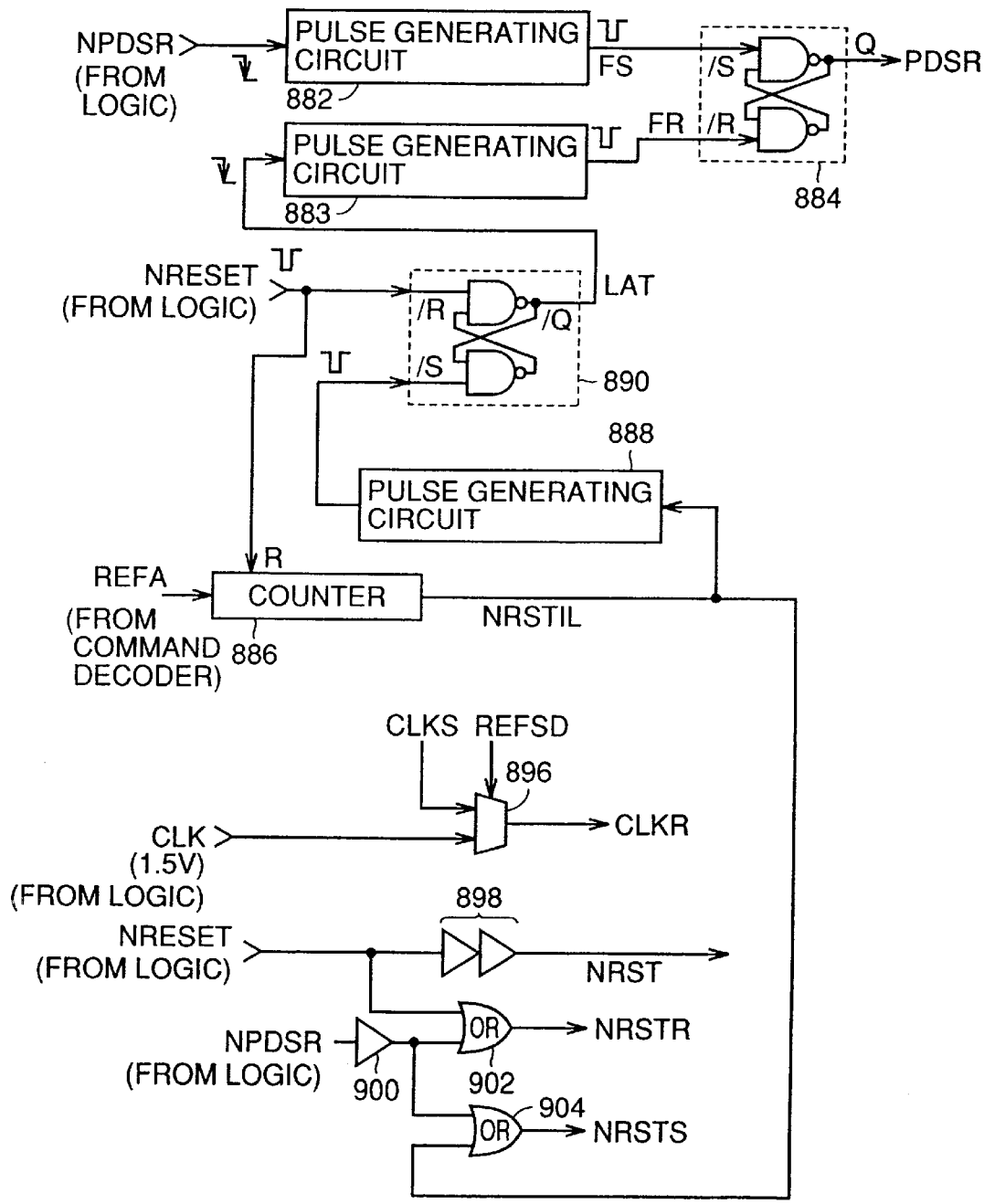
FIG. 32 is a circuit diagram showing a structure of a clock/reset control circuit 806 in FIG. 30.

FIG. 32 is a circuit diagram showing a structure of clock/reset control circuit 806 in FIG. 30.

Referring to FIG. 32, clock/reset control circuit 806 includes a buffer circuit 898 receiving reset signal NRESET from the logic portion to supply reset signal NRST to the inside, a buffer circuit 900 receiving signal NPDSR from the logic portion, and an OR circuit 902 receiving signal NRESET and an output of buffer circuit 900 and outputting signal NRSTR.

Clock reset control circuit 806 further includes a pulse generating circuit 882 receiving signal NPDSR from the logic portion and generating a low-active pulse signal on the fall of the received signal, a counter 886 receiving refresh command signal REFA from a command decoder after reset by reset signal NRESET to carry out counting up and change an output when eight inputs are received, an OR circuit 904 receiving an output of counter 886 and an output of buffer 900 and outputting signal NRSTS, a pulse generating circuit 888 generating a low-active pulse according to an output of counter 886, and a latch circuit 896 set by an output of pulse generating circuit 888 and reset by reset signal NRESET.

Clock/reset control circuit 806 further includes a pulse generating circuit 883 receiving signal LAT which is a /Q output signal of latch circuit 890 and generating a low-active pulse signal on the falling of the received signal, and a latch circuit 884 set by an output of pulse generating circuit 882 and reset by an output of pulse generating circuit 883. Power down self refresh signal PDSR is supplied from the Q output of latch circuit 884.

Clock/reset control circuit 860 further includes a selector 896 receiving clock signal CLK having 1.5V amplitude supplied from the logic portion and clock signal CLKS generated by self timer 816 in FIG. 30, and selecting any of clock signals according to signal REFSD to output it as clock signal CLKR.

Figure 33:
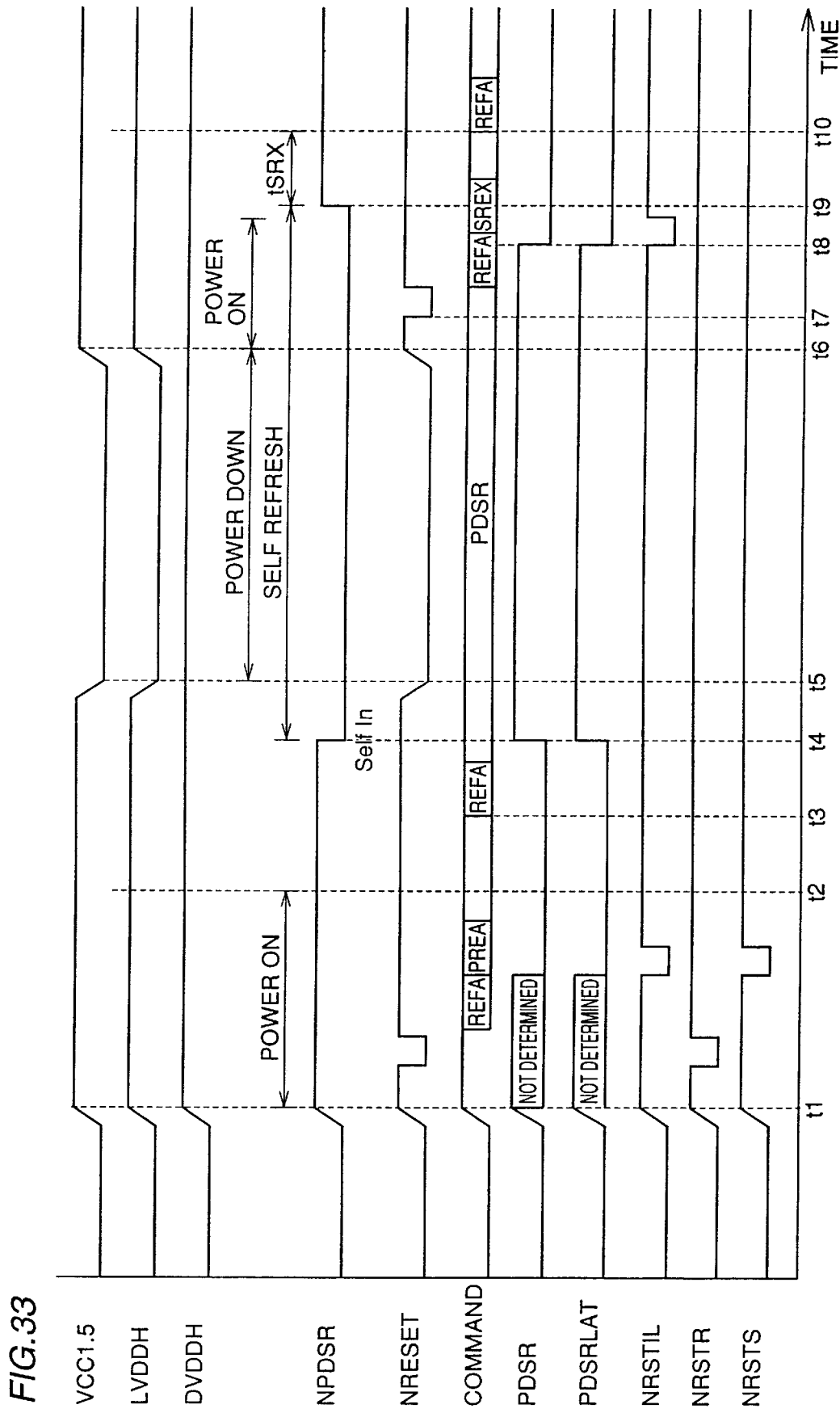
FIG. 33 is an operation waveform chart illustrating a power down mode of the DRAM portion of the semiconductor device in FIG. 30.

FIG. 33 is an operation waveform chart illustrating power down mode of the DRAM portion of the semiconductor device shown in FIG. 30.

Referring to FIGS. 30 and 33, at time t1, power is applied to semiconductor device 800. Then reset signal NRESET is supplied from logic portion 802 to the DRAM portion and subsequently a power-on-sequence is carried out in which refresh command REFA is supplied several times. At time t2, the power on sequence is completed and the normal operation can be carried out accordingly.

Preceding transition to the power down mode at time t3, an auto refresh command is supplied from the logic portion to the DRAM portion at time t3 to refresh the entire memory space. Then at the time t4, the logic portion sets signal NPDSR at L level to cause the DRAM portion to start a self refresh operation. From time t4, the DRAM portion is in the power down mode.

At time t5, supply potential LVDDH and 1.5V supply potential VCC1.5 applied to the logic portion are set in the off state and accordingly the power down mode is started. Specifically, supply potential applied for self refresh is 3.3V supply potential DVDDH only. When the mode returns from the power down mode to the operation mode at time t6, 1.5V supply potential VCC1.5 is applied and successively a stable clock signal is applied.

At time t7, reset signal NRESET is fixed at L level for 200 μ minutes, and thereafter reset signal NRESET is set at H level to cancel reset and refresh command REFA is input eight times to initialize the internal circuit. After this, self refresh exit command SREX for terminating the self refresh is input and signal NPDSR is raised from L level to H level. Then after the time period represented by tSRX, the logic portion supplies an auto refresh command to the DRAM portion and the DRAM portion refreshes the entire memory space. After the last refresh command REFA is issued, all banks are inactivated and command can be input after the minimum read cycle time tRC+1 clock passes.

Figure 34:
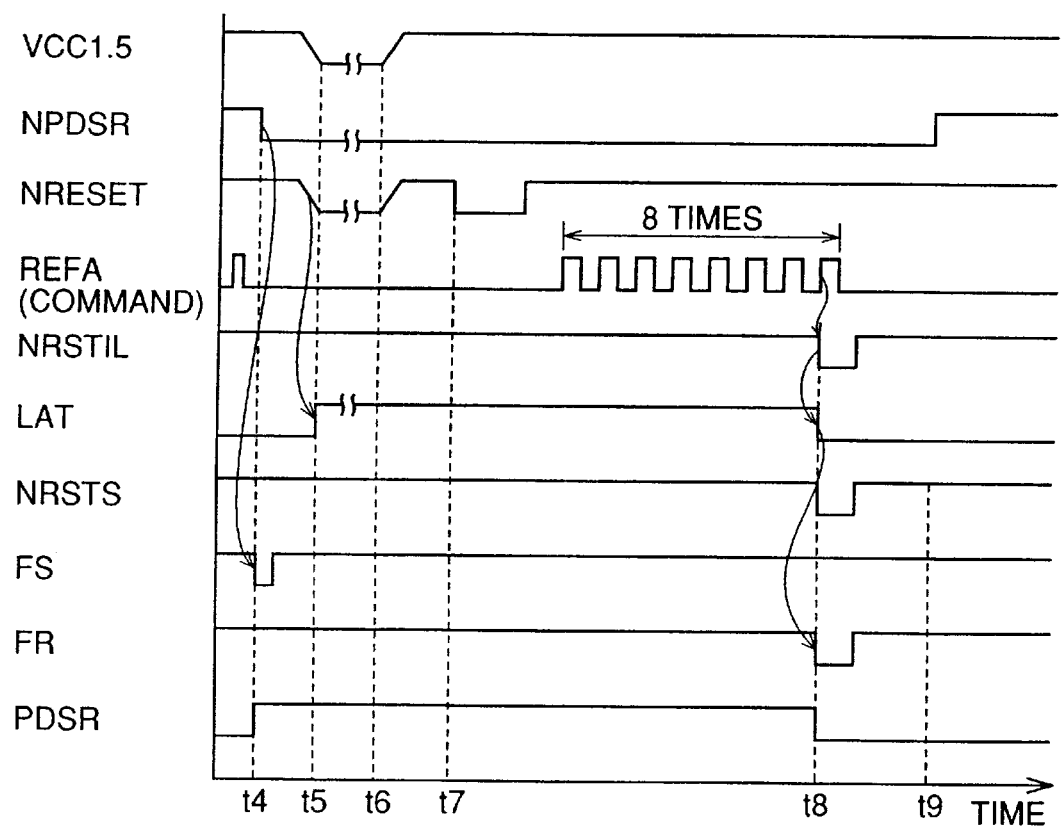
FIG. 34 is a waveform chart illustrating an operation of returning from the power down mode in FIG. 33 to an operation mode.
Figure 35:
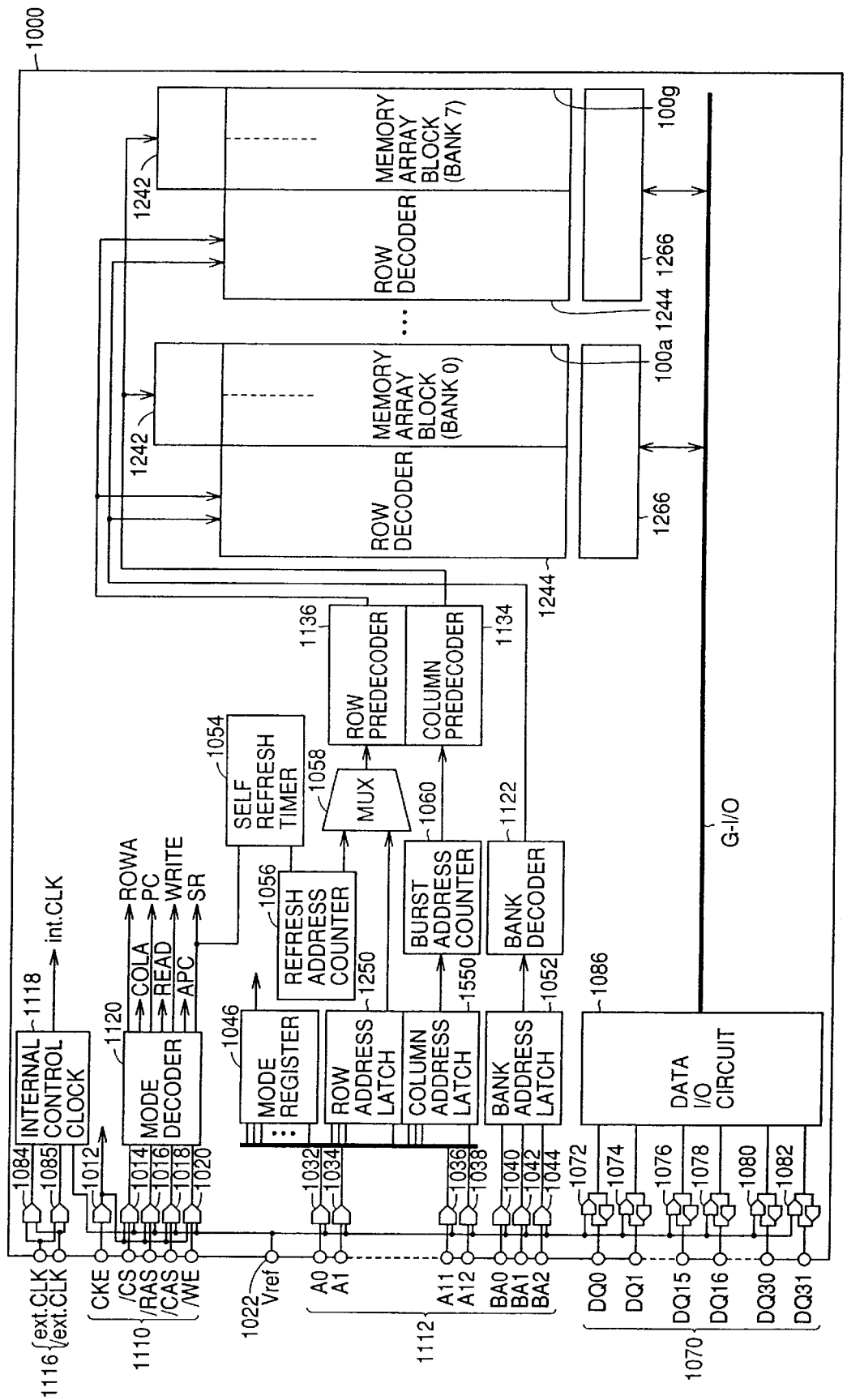
FIG. 35 is a schematic block diagram showing a structure of a conventional semiconductor memory device 1000.
Figure 36:
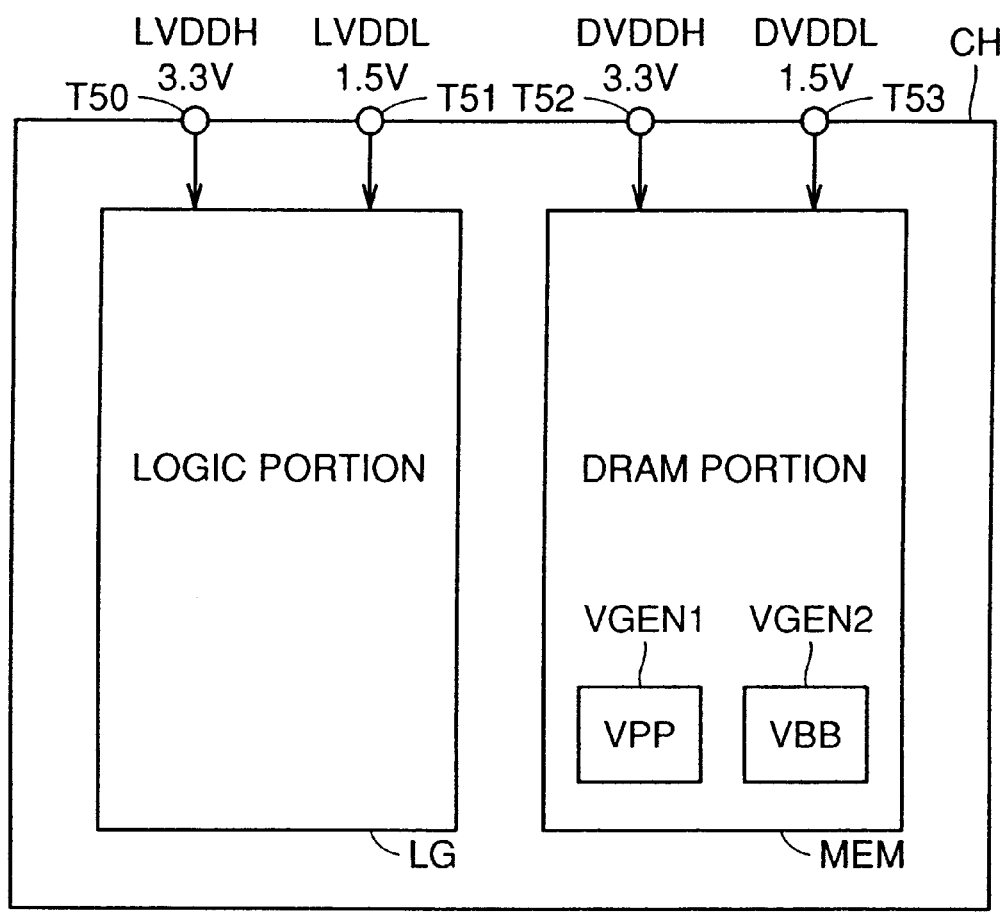
FIG. 36 illustrates supply potential applied from the outside to the conventional system LSI.
Figure 37:
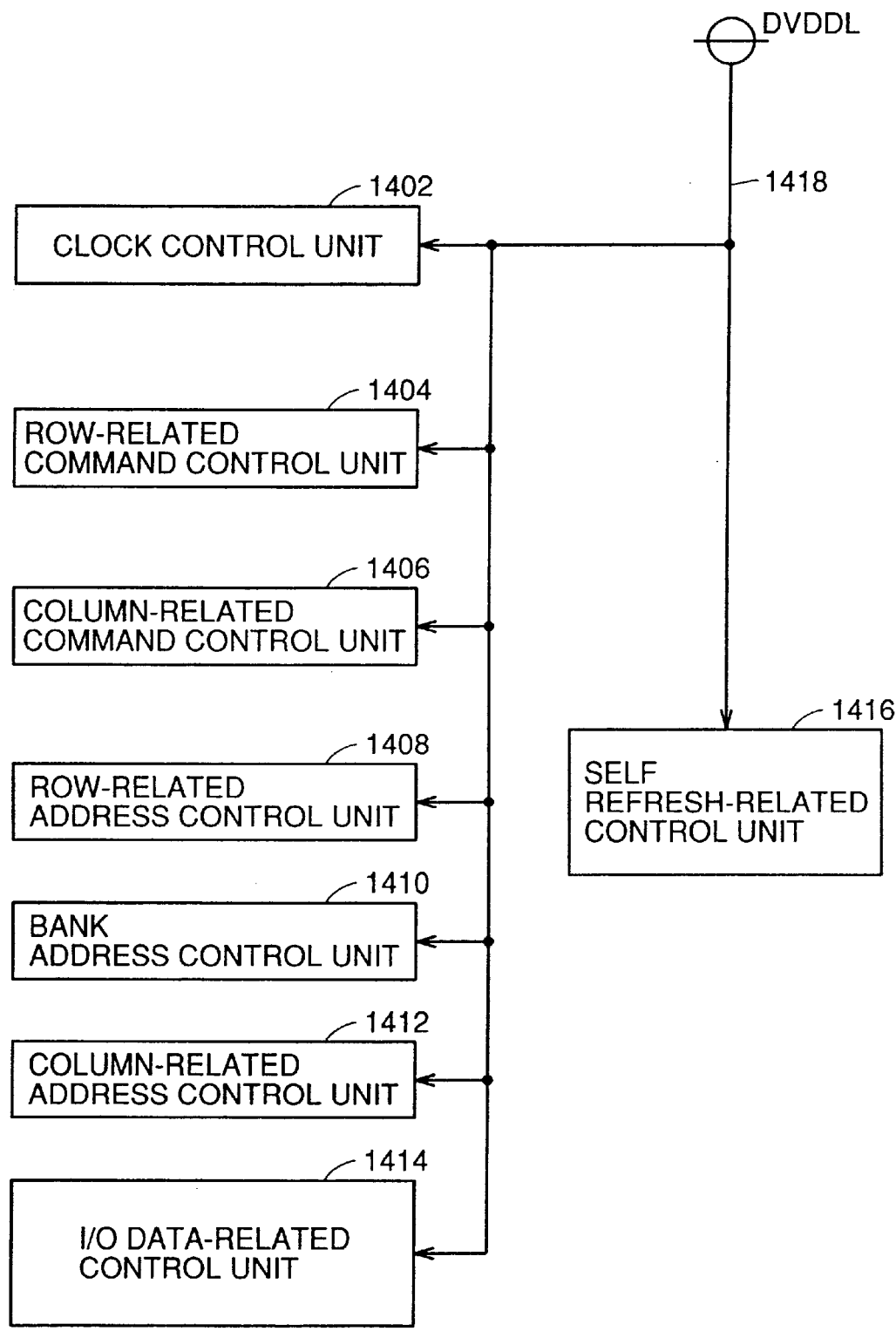
FIG. 37 illustrates power supply potential applied to a peripheral circuit of the DRAM portion MEM in FIG. 36.

FIG. 34 is a waveform chart illustrating an operation when the mode returns from the power down mode to the operation mode in FIG. 33.

Referring to FIGS. 32 and 34, at time t4, signal NPDSR falls to L level and accordingly pulse generating circuit 882 generates low-active pulse signal FS. Accordingly latch circuit 884 is set and signal PDSR is set at H level.

At time t7, reset signal NRESET after cancellation of power down is input and then latch circuit 890 is reset. Refresh command REFA is input eight times and then at time t8, an output of counter 886 generates a pulse signal to set latch circuit 890. Signal LAT as the IQ output of latch circuit 890 then falls from H level to L level and latch circuit 884 is reset according to an output of pulse generating circuit 883. Signal PDSR is then at L level and thereafter the normal operation can be carried out.

The return sequence from the power down mode is the same as the normal power supply sequence. After reset by reset signal NRESET, refresh command REFA is input eight times to reset all special modes set in a mode register and the like.

After this, at time t9, signal NPDSR rises to H level. Signal NPDSR is used for transition to the power down mode and having no influence on an operation when it rises to H level any time after the mode returns to the normal mode.

As heretofore described, current consumption in the standby state is reduced in the power down mode of the semiconductor device according to the third embodiment. After the mode returning, a normal high speed operation is possible by predetermined input.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having, as its operation mode, a normal mode and a power down mode with smaller current consumption than that of said normal mode, comprising:

a logic unit outputting a mode switch signal indicative of transition from said normal mode to said power down mode and outputting a reset signal for transition back to said normal mode from said power down mode; and an internal circuit making a transition to a state with power consumption smaller than that in said normal made, said internal circuit being initialized in response to said reset signal for making a transition from said power down mode back to said normal mode, wherein said internal circuit includes a memory array transmitting/receiving data and holding said data in volatile manner in said normal mode and holding said data in volatile manner in said power down mode, a first control circuit issuing a power-down self-refresh command in response to said mode switch signal for transition from said normal mode to said power down mode, a second control circuit outputting a reference clock signal for a self-refresh operation when said power-down self-refresh command is issued by said first control circuit and when a self-refresh command is issued by said logic unit, and a peripheral circuit controlling activation of said memory array in response to said reference clock signal.

2. A semiconductor device having, as its operation mode, a normal mode and a power down mode with smaller current consumption than that of said normal mode, comprising:

a logic unit outputting a mode switch signal indicative of transition from said normal mode to said power down mode and outputting a reset signal for transition back to said normal mode from said power down mode; and an internal circuit making a transition to a state with power consumption smaller than that in said normal made, said internal circuit being initialized in response to said reset signal for making a transition from said power down mode back to said normal mode, wherein said internal circuit includes a power supply circuit generating an internal power supply potential from a first power supply potential in said normal mode and generating said internal power supply potential from a second power supply potential in said power down mode, a memory array transmitting/receiving data and holding said data in volatile manner in said normal mode and holding said data in volatile manner in said power down mode, a peripheral circuit receiving said internal power supply potential as an operating power supply potential for controlling activation of said memory array, and a control circuit setting said peripheral circuit in a self-refresh mode in response to said mode switch signal, wherein said logic unit provides an instruction to said internal circuit to make a transition from said power down mode to said normal mode after said first power supply potential is activated.

3. A semiconductor device having, as its operation mode, a normal mode and a power down mode with smaller current consumption than that of said normal mode, comprising:

a logic unit outputting a mode switch signal indicative of transition from said normal mode to said power down mode and outputting a reset signal for transition back to said normal mode from said power down mode; and an internal circuit making a transition to a state with power consumption smaller than that in said normal made, said internal circuit being initialized in response to said reset signal for making a transition from said power down mode back to said normal mode, wherein said internal circuit includes a memory array transmitting/receiving data and holding said data in volatile manner in said normal mode and holding said data in volatile manner in said power down mode, and a peripheral circuit initialized in response to said reset signal for controlling activation of said memory array according to a plurality of commands, wherein said logic unit provides an instruction to said peripheral circuit to make a transition from said power down mode to said normal mode, by providing one of said plurality of commands multiple times after initialization of said peripheral circuit by said reset signal.

* * * * *